US012796142B2

(12) United States Patent
Jung et al.

(10) Patent No.: US 12,796,142 B2
(45) Date of Patent: Nov. 10, 2026

(54) IMAGE SENSOR

(71) Applicant: Samsung Electronics Co., Ltd., Suwon-si (KR)

(72) Inventors: Min Ji Jung, Hwaseong-si (KR); Doo Sik Seol, Suwon-si (KR); Sung Min An, Suwon-si (KR); Kyung Duck Lee, Hwaseong-si (KR); Kyung Ho Lee, Suwon-si (KR); Seung Ki Jung, Bucheon-si (KR); You Jin Jeong, Yongin-si (KR); Tae Sub Jung, Hwaseong-si (KR); Jeong Jin Cho, Yongin-si (KR); Masato Fujita, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 922 days.

(21) Appl. No.: 17/537,926

(22) Filed: Nov. 30, 2021

(65) Prior Publication Data

US 2022/0344384 A1 Oct. 27, 2022

(30) Foreign Application Priority Data

Apr. 23, 2021 (KR) ........................ 10-2021-0052989

(51) Int. Cl.

| | |
|---|---|
| ***H10F 39/18*** | (2025.01) |
| ***H10F 39/00*** | (2025.01) |
| *H10F 39/12* | (2025.01) |

(52) U.S. Cl.

CPC ........... *H10F 39/807* (2025.01); *H10F 39/18* (2025.01); *H10F 39/182* (2025.01); (Continued)

(58) Field of Classification Search

CPC ........... H01L 27/14607; H01L 27/1461; H01L 27/1463; H01L 27/1464; H01L 27/14643; (Continued)

(56) References Cited

U.S. PATENT DOCUMENTS

| | | | |
|---|---|---|---|
| 9,876,044 | B2 | 1/2018 | Lee et al. |
| 9,973,682 | B2 | 5/2018 | Ham |

(Continued)

FOREIGN PATENT DOCUMENTS

| | | |
|---|---|---|
| JP | 2013-239787 A | 11/2013 |
| JP | 6118058 B2 | 4/2017 |

(Continued)

OTHER PUBLICATIONS

Office Action dated Apr. 10, 2025 issued in Korean Patent Application No. 10-2021-0052989. (Note: US 2020/0273894 A cited therein is already of record).

(Continued)

*Primary Examiner* — Molly K Reida

(74) *Attorney, Agent, or Firm* — MORGAN, LEWIS & BOCKIUS LLP

(57) ABSTRACT

An image sensor includes a substrate with a first surface opposite a second surface, a pixel isolation pattern defining first and second unit pixels adjacent to each other in the substrate, and first and second separation patterns in the substrate. The first unit pixel includes first and second photoelectric conversion parts along a first direction. The second unit pixel includes third and fourth photoelectric conversion parts along a second direction intersecting the first direction. The first separation pattern extends in the second direction between the first and second photoelectric conversion parts. The second separation pattern extends in the first direction between the third and fourth photoelectric conversion parts. A width of the pixel isolation pattern, a (Continued)

width of the first separation pattern, and a width of the second separation pattern each decrease from the second surface of the substrate toward the first surface of the substrate.

9 Claims, 35 Drawing Sheets

(52) U.S. Cl.
CPC ..... *H10F 39/8027* (2025.01); *H10F 39/8053* (2025.01); *H10F 39/8063* (2025.01); *H10F 39/199* (2025.01)

(58) Field of Classification Search
CPC ...... H10F 39/18; H10F 39/182; H10F 39/802; H10F 39/8023; H10F 39/8027; H10F 39/807
See application file for complete search history.

(56) References Cited

U.S. PATENT DOCUMENTS

| | | | | |
|---|---|---|---|---|
| 10,177,192 | B2 | 1/2019 | Lee | |
| 2017/0104020 | A1* | 4/2017 | Lee | H01L 27/1463 |
| 2020/0235149 | A1* | 7/2020 | Shiraishi | H01L 27/14627 |
| 2020/0243578 | A1* | 7/2020 | Pyo | H01L 27/14609 |
| 2020/0273894 | A1* | 8/2020 | Inui | H01L 27/1464 |
| 2020/0358989 | A1 | 11/2020 | Hoshino | |
| 2021/0313362 | A1 | 10/2021 | Shiraishi et al. | |
| 2022/0123034 | A1* | 4/2022 | Kono | H10F 39/8053 |
| 2024/0213283 | A1 | 6/2024 | Pyo et al. | |

FOREIGN PATENT DOCUMENTS

| | | | |
|---|---|---|---|
| JP | 2018-201015 | A | 12/2018 |
| JP | 2020141122 | A | 9/2020 |
| KR | 10-2017-0043140 | A | 4/2017 |
| KR | 10-2020-0014722 | A | 2/2020 |
| KR | 10-2020-0090763 | A | 7/2020 |
| KR | 10-2020-0095340 | A | 8/2020 |
| WO | 2019102887 | A1 | 5/2019 |

OTHER PUBLICATIONS

Office Action dated Feb. 3, 2026 issued in the corresponding Japanese Patent Application No. 2022-059835. (Note: JP2018/201015A, and US2020/0243578A already submitted.).

Office Action dated Jun. 2, 2026 issued in the corresponding Japanese Patent Application No. 2022-059835. (Note: WO2019/102887A, JP2018/201015A, and US2020/0243578A already submitted.).

Notice of Allowance dated Jun. 1, 2026 issued in the corresponding Korean Patent Application No. 10-2021-0052989. (Note: US20200273894 A1, KR1020200014722 A, KR1020170043140 A, KR1020200095340 A, and US20200243578 A1 already submitted.).

* cited by examiner

IMAGE SENSOR

This application claims priority to Korean Patent Application No. 10-2021-0052989, filed on Apr. 23, 2021, and all the benefits accruing therefrom under 35 U.S.C. § 119, the disclosure of which is incorporated herein by reference in its entirety.

BACKGROUND

1. Technical Field

The present disclosure relates to an image sensor. More specifically, the present disclosure relates to a CMOS type image sensor.

2. Description of the Related Art

An image sensor is an element that converts an optical image into an electric signal. As the computer industry and the telecommunication industry develop, image sensors with improved performance may be required in various fields, such as applications for a smartphone, a wearable device, a digital camera, a PCS (Personal Communication System), a game console, a security camera and a medical micro camera.

Such an image sensor may include a charge coupled device (CCD) image sensor and a complementary metal-oxide semiconductor (CMOS) image sensor. Among them, because the CMOS image sensor has a simple drive system and may integrate a signal processing circuit on a single chip, miniaturization of the product may be easy. Further, the CMOS image sensor may have very low power consumption, and is therefore easily may be applied to a product having a limited battery capacity.

Recently, a backside illumination (BSI) image sensor, in which incident light is radiated through a back side of a semiconductor substrate so that the pixels formed in the image sensor have improved light-receiving efficiency and light sensitivity, is being studied.

SUMMARY

Aspects of embodiments of inventive concepts in the present disclosure provide an image sensor having improved performance.

However, aspects of inventive concepts are not restricted to the one set forth herein. And other aspects of embodiments of inventive concepts of the present disclosure will become more apparent to one of ordinary skill in the art to which the present disclosure pertains by referencing the detailed description of embodiments of inventive concepts given below.

According to an embodiment, an image sensor incudes a substrate, a pixel isolation pattern, a first separation pattern, and a second separation pattern. The substrate includes a first surface on which light is incident and a second surface opposite to the first surface. The pixel isolation pattern defines a first unit pixel and a second unit pixel adjacent to each other in the substrate. The first unit pixel includes a first photoelectric conversion part and a second photoelectric conversion part arranged along a first direction. The second unit pixel includes a third photoelectric conversion part and a fourth photoelectric conversion part arranged along a second direction intersecting the first direction. The first separation pattern extends in the second direction. The first separation pattern is in the substrate between the first photoelectric conversion part and the second photoelectric conversion part. The second separation pattern extends in the first direction. The second separation pattern is in the substrate between the third photoelectric conversion part and the fourth photoelectric conversion part. A width of the pixel isolation pattern, a width of the first separation pattern, and a width of the second separation pattern each decrease from the second surface of the substrate toward the first surface of the substrate.

According to an embodiment, an image sensor includes a first unit pixel in a substrate and configured to detect light of a first color; and a second unit pixel in the substrate adjacent to the first unit pixel and configured to detect light of the first color. The first unit pixel includes a first photoelectric conversion part and a second photoelectric conversion part arranged along a first direction. The second unit pixel includes a third photoelectric conversion part and a fourth photoelectric conversion part arranged along a second direction intersecting the first direction.

According to an embodiment, an image sensor includes a first pixel group and a second pixel group in a substrate. The first pixel group is configured to detect light of a first color. The second pixel group is adjacent to the first pixel group and configured to detect light of a second color different from the first color. Each of the first pixel group and the second pixel group includes a first unit pixel and a second unit pixel adjacent to each other. The first unit pixel includes a first photoelectric conversion part and a second photoelectric conversion part arranged along a first direction. The second unit pixel includes a third photoelectric conversion part and a fourth photoelectric conversion part arranged along a second direction intersecting the first direction.

According to an embodiment, an image sensor includes a first pixel group and a second pixel group in a substrate. The first pixel group includes a plurality of first unit pixels adjacent to each other and configured to detect light of a first color. The second pixel group is adjacent to the first pixel group. The second pixel group includes a plurality of second unit pixels adjacent to each other and configured to detect light of a second color different from the first color. Each of the plurality of first unit pixels includes a first photoelectric conversion part and a second photoelectric conversion part arranged along a first direction. Each of the plurality of second unit pixels includes a third photoelectric conversion part and a fourth photoelectric conversion part arranged along a second direction intersecting the first direction.

BRIEF DESCRIPTION OF THE DRAWINGS

The above and other aspects and features of inventive concepts will become more apparent by describing in detail example embodiments of inventive concepts thereof with reference to the attached drawings, in which.

DETAILED DESCRIPTION OF THE EMBODIMENTS

Although terms such as first and second are used herein to describe various elements or components, it goes without saying that elements and components are not limited by such terms. Such terms are used to only distinguish a single element or component from other elements or components. Therefore, it goes without saying that a first element or component described below may be a second element or component in embodiments of inventive concepts.

Hereinafter, various image sensors according to example embodiments will be described referring to FIGS. 1 to 25.

Figure 1:
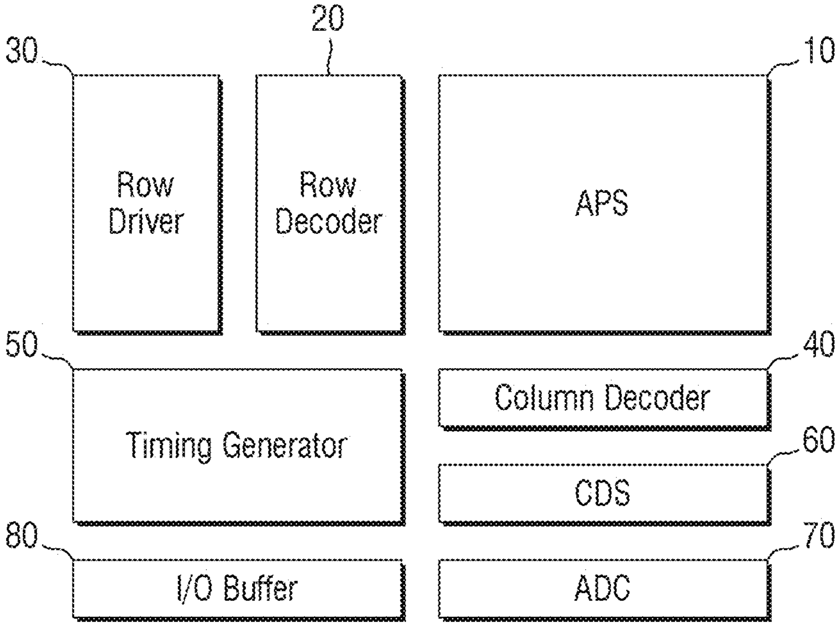
FIG. 1 is an example block diagram for explaining an image sensor according to some embodiments.

FIG. 1 is an example block diagram for explaining an image sensor according to some embodiments.

Referring to FIG. 1, the image sensor according to some embodiments includes an active pixel sensor array (APS) 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 includes a plurality of unit pixels arranged two-dimensionally, and may convert an optical signal into an electric signal. The active pixel sensor array 10 may be driven by the plurality of drive signals, such as a pixel selection signal, a reset signal and a charge transfer signal, from the row driver 30. Also, the electrical signal converted by the active pixel sensor array 10 may be provided to the correlated double sampler 60.

The row driver 30 may provide a large number of drive signals for driving a plurality of unit pixels to the active pixel sensor array 10 according to the results decoded by the row decoder 20. When the unit pixels are arranged in the form of a matrix, the drive signals may be provided for each row.

The timing generator 50 may provide a timing signal and a control signal to the row decoder 20 and the column decoder 40.

The correlated double sampler (CDS) 60 may receive, hold and sample the electrical signals generated by the active pixel sensor array 10. The correlated double sampler 60 may doubly sample a specific noise level and a signal level due to an electrical signal, and output a difference level corresponding to a difference between the noise level and the signal level.

The analog-to-digital converter (ADC) 70 may convert the analog signal corresponding to the difference level, which is output from the correlated double sampler 60, into a digital signal and output the digital signal.

The I/O buffer 80 latches the digital signal, and the latched signal sequentially may output the digital signal to a video signal processing unit (not shown) according to the decoding result from the column decoder 40.

Figure 2:
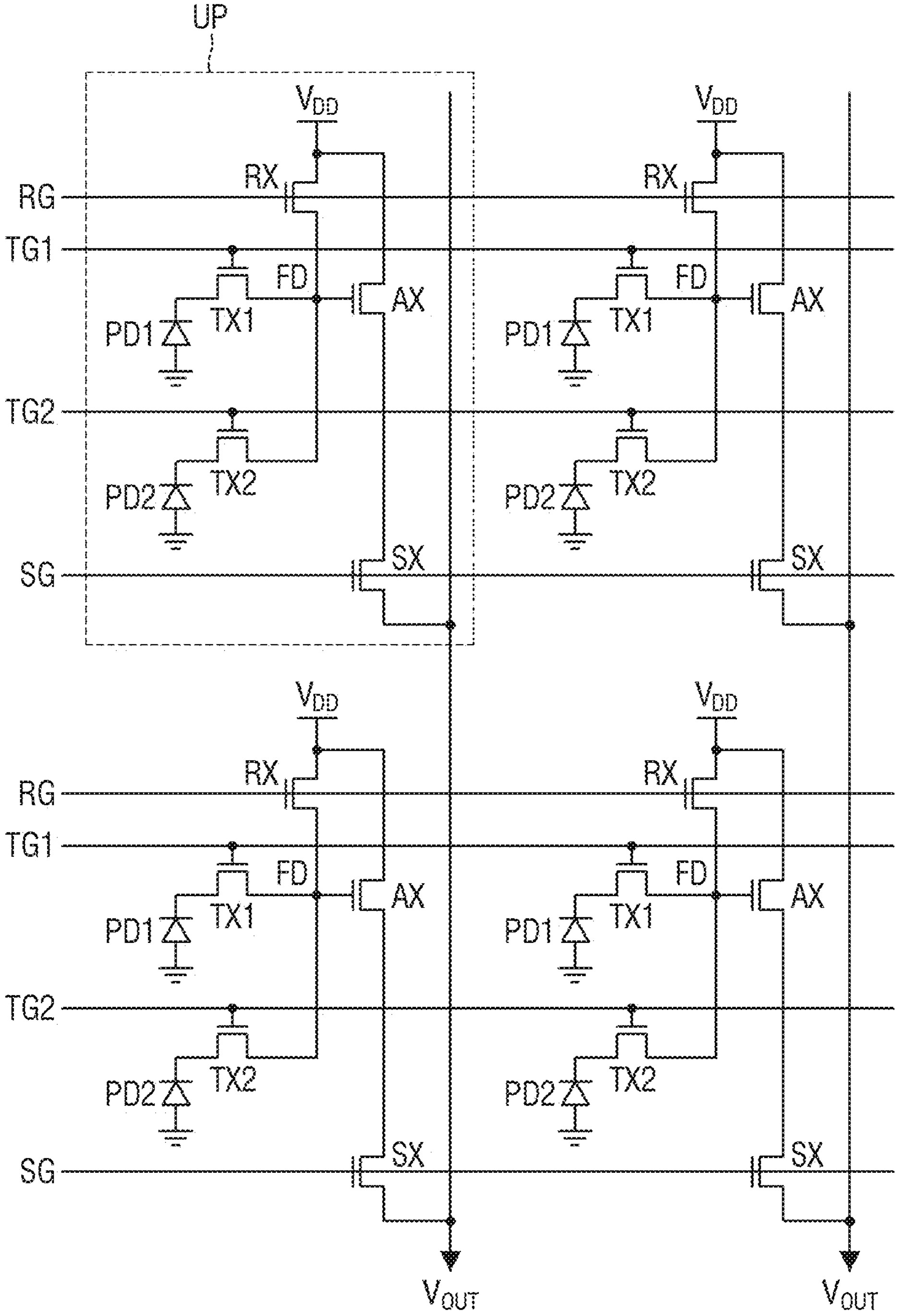
FIG. 2 is an example circuit diagram for explaining a unit pixel of an image sensor according to some embodiments.

FIG. 2 is an example circuit diagram for explaining a unit pixel of an image sensor according to some embodiments.

Referring to FIG. 2, the image sensor according to some embodiments includes a plurality of unit pixels UP.

The unit pixels UP may be arranged in the form of matrix along a row direction and a column direction. Each unit pixel UP may include photoelectric conversion elements PD1 and PD2, a floating diffusion region FD, and control transistors TX1, TX2, RX, SX and AX.

In some embodiments, the control transistors TX1, TX2, RX, SX and AX may include a first transfer transistor TX1, a second transfer transistor TX2, a reset transistor RX, a selection transistor SX, and an amplification transistor AX. Gate electrodes of the first transfer transistor TX1, the second transfer transistor TX2, the reset transistor RX and the selection transistor SX may be connected to the drive signal lines TG1, TG2, RG and SG, respectively.

Each unit pixel UP may include a pair of divided photoelectric conversion parts (hereinafter, a first photoelectric conversion element PD1 and a second photoelectric conversion element PD2). The first photoelectric conversion element PD1 and the second photoelectric conversion element PD2 may each generate electric charges in proportion to an amount of light that is incident from the outside. The first photoelectric conversion element PD1 may be coupled with the first transfer transistor TX1, and the second photoelectric conversion element PD2 may be coupled with the second transfer transistor TX2.

Since a floating diffusion region FD is a region that converts electric charge into voltage, and has a parasitic capacitance, the electric charge may accumulate and may be stored. The first transfer transistor TX1 is driven by a first transfer line TG1 that applies a desired and/or alternatively predetermined bias, and may transmit the electric charge generated from the first photoelectric conversion element PD1 to the floating diffusion region FD. Further, the second transfer transistor TX2 is driven by a second transfer line TG2 that applies a desired and/or alternatively predetermined bias, and may transmit the electric charge generated from the second photoelectric conversion element PD2 to the floating diffusion region FD.

In some embodiments, the first transfer transistor TX1 and the second transfer transistor TX2 may share the floating diffusion region FD. For example, one end of the first transfer transistor TX1 may be connected to the first photoelectric conversion element PD1, and the other end of the first transfer transistor TX1 may be connected to the floating diffusion region FD. Further, one end of the second transfer transistor TX2 may be connected to the second photoelectric conversion element PD2, and the other end of the second transfer transistor TX2 may be connected to the floating diffusion region FD.

The reset transistor RX may periodically reset the floating diffusion region FD. The reset transistor RX may be driven by a reset line RG that applies a desired and/or alternatively predetermined bias. When the reset transistor RX is turned on, a desired and/or alternatively predetermined electrical potential provided to the drain of the reset transistor RX, for example, a power supply voltage VDD, may be sent to the floating diffusion region FD.

The amplification transistor AX amplifies a potential change in the floating diffusion region FD to which the electric charges are sent from the first photoelectric conversion element PD1 and the second photoelectric conversion element PD2, and may output it as an output voltage VOUT. The amplification transistor AX may be a source follower buffer amplifier that generates a source-drain current in proportion to an amount of charge in the floating diffusion region FD. For example, the gate electrode of the amplification transistor AX may be connected to the floating diffusion region FD. Accordingly, a desired and/or alternatively predetermined electrical potential provided to the drain of the amplification transistor AX, for example, the power supply voltage VDD, may be sent to the drain region of the selection transistor SX.

The selection transistor SX may select a unit pixel UP to be read on a row basis. The selection transistor SX may be driven by a selection line SG that applies a desired and/or alternatively predetermined bias. Accordingly, the output voltage $V_{OUT}$ of the unit pixel UP selected by the selection transistor SX may be output.

Figure 3:
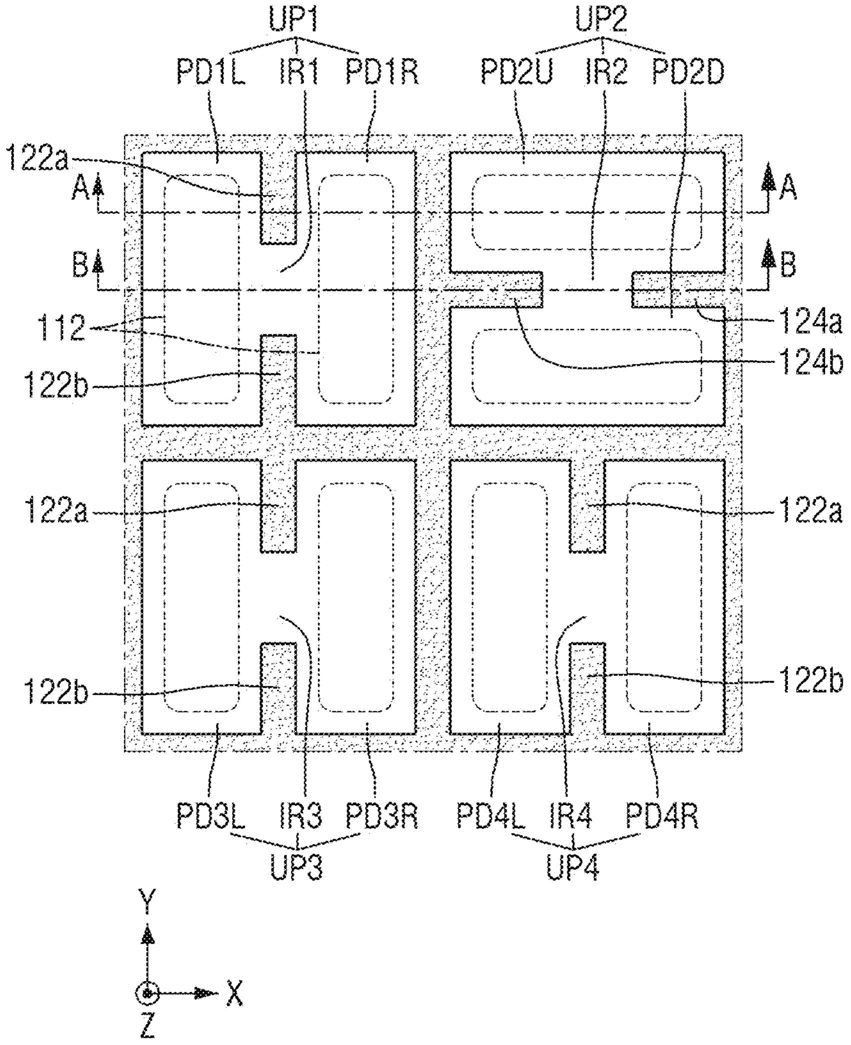
FIG. 3 is a layout diagram for explaining unit pixels of an image sensor according to some embodiments.
Figure 4:
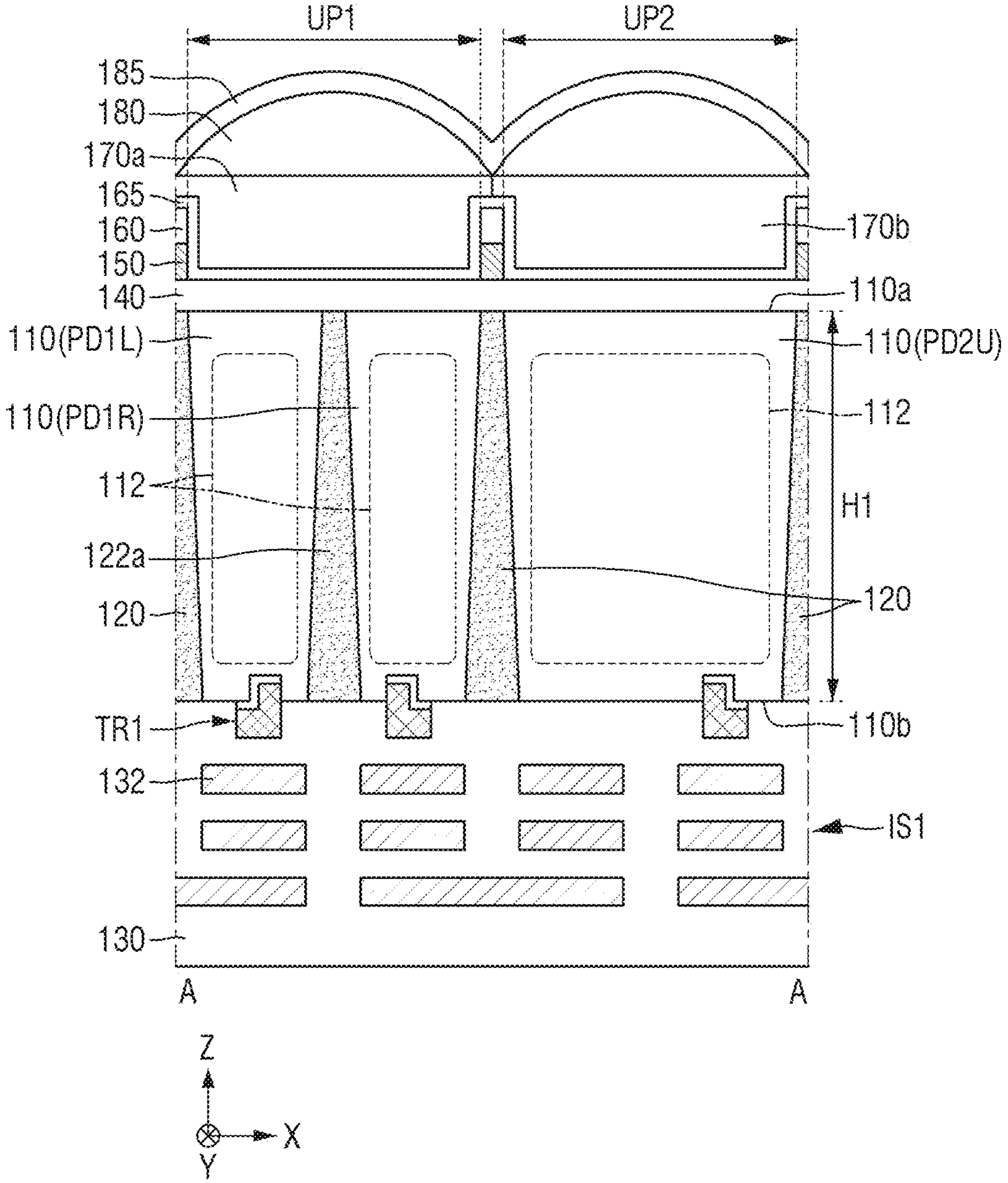
FIG. 4 is a schematic cross-sectional view taken along A-A of FIG. 3.
Figure 5:
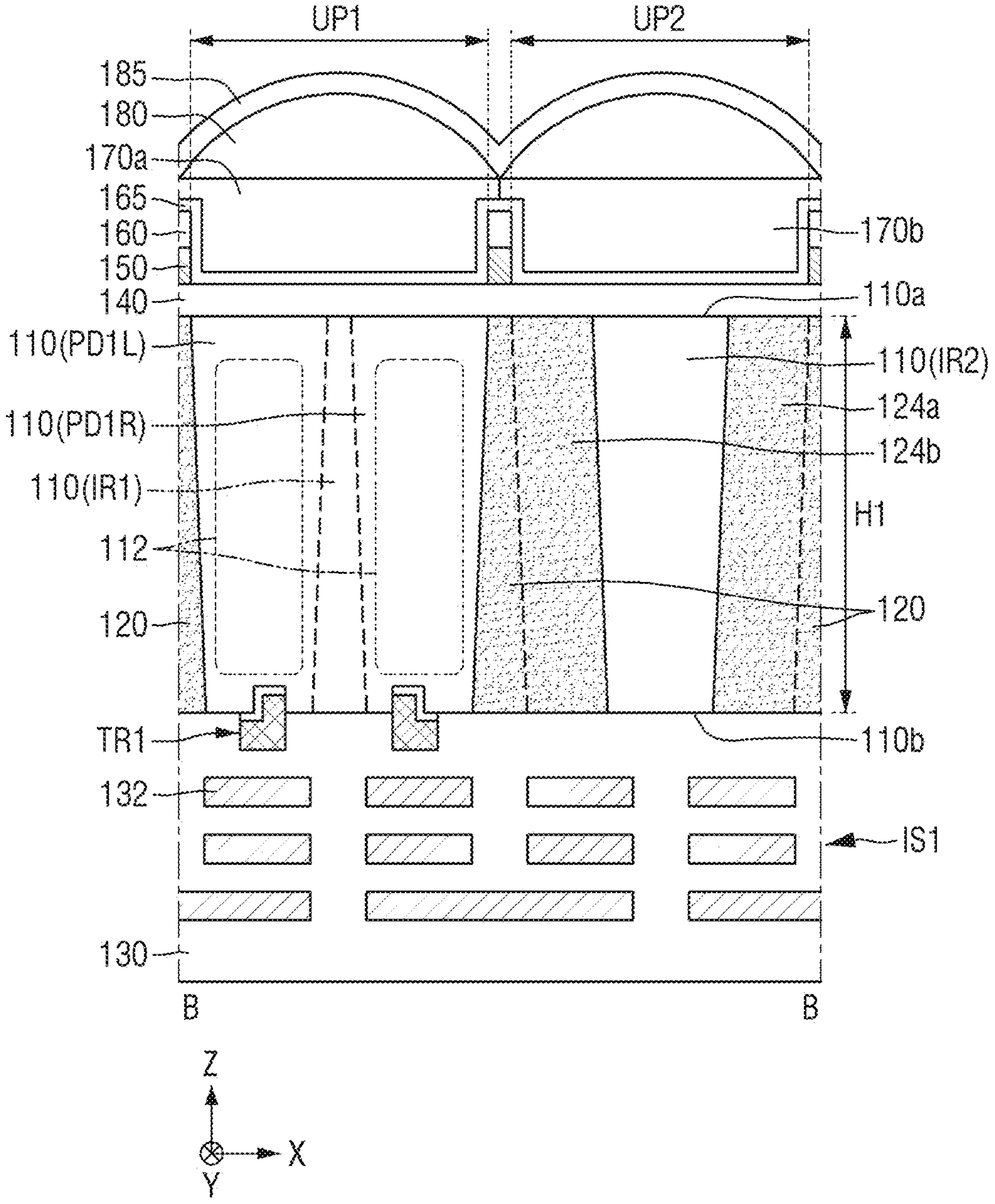
FIG. 5 is a schematic cross-sectional view taken along B-B of FIG. 3.
Figure 6:
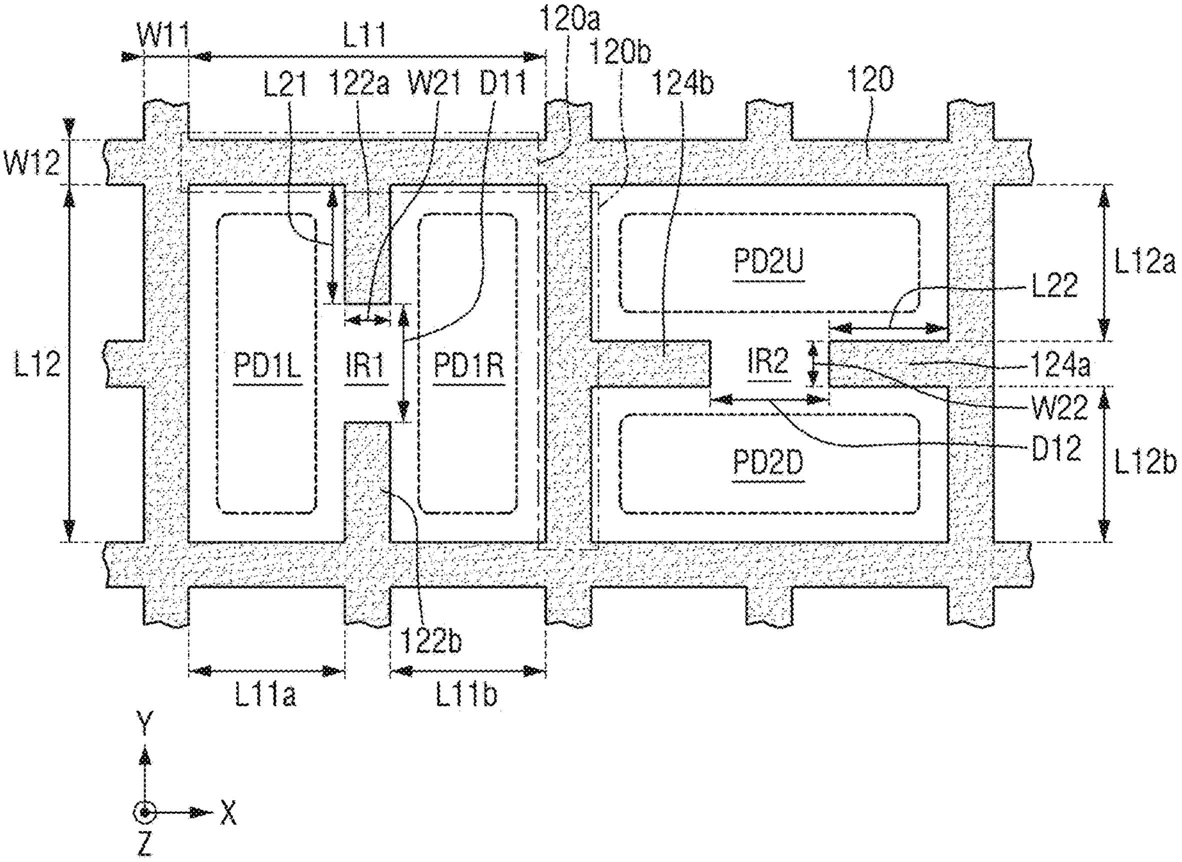
FIG. 6 is a layout diagram for explaining a first unit pixel and a second unit pixel of FIG. 3.

FIG. 3 is a layout diagram for explaining unit pixels of an image sensor according to some embodiments. FIG. 4 is a schematic cross-sectional view taken along A-A of FIG. 3. FIG. 5 is a schematic cross-sectional view taken along B-B of FIG. 3. FIG. 6 is a layout diagram for explaining a first unit pixel and a second unit pixel of FIG. 3.

Referring to FIGS. 3 to 6, the image sensor according to some embodiments includes a first substrate 110, unit pixels UP1 to UP4, a pixel isolation pattern 120, first separation patterns 122*a* and 122*b*, second separation patterns 124*a* and 124*b*, a first wiring structure IS1, a surface insulating film 140, color filters 170*a* and 170*b*, and a microlens 180.

The first substrate 110 may be a semiconductor substrate. For example, the first substrate 110 may be bulk silicon or SOI (silicon-on-insulator). The first substrate 110 may be a silicon substrate or may include other materials, for example, silicon germanium, indium antimonide, lead tellurium compounds, indium arsenic, indium phosphide, gallium arsenide or gallium antimonide. Alternatively, the first substrate 110 may have an epitaxial layer formed on a base substrate.

The first substrate 110 may include a first surface 110*a* and a second surface 110*b* that are opposite to each other. In embodiments to be described below, the first surface 110*a* may be referred to as a back side of the first substrate 110, and the second surface 110*b* may be referred to as a front side of the first substrate 110. The first surface 110*a* of the first substrate 110 may be a light-receiving surface on which light is incident. That is, the image sensor according to some embodiments may be a backside illumination (BSI) image sensor.

In some embodiments, the first substrate 110 may include, for example, impurities of a first conductive type. In embodiments described below, although the first conductive type will be described as being a p-type, this is merely an example, and the first conductive type may, of course, be an n-type.

In some embodiments, a thickness of the first substrate 110 may be about 5000 nm to about 6,000 nm. Here, the thickness of the first substrate 110 means a thickness in a third direction Z that intersects the first surface 110*a* and the second surface 110*b*. For example, a spaced distance H1 between the first surface 110*a* and the second surface 110*b* may be about 5000 nm to about 6,000 nm.

A plurality of unit pixels UP1 to UP4 may be formed in the first substrate 110. The unit pixels UP1 to UP4 may be arranged two-dimensionally (for example, in the form of a matrix) in a plane including the first direction X and the second direction Y that intersect the third direction Z.

The unit pixels UP1 to UP4 may include first to fourth unit pixels UP1 to UP4 that are adjacent to each other. As an example, the first unit pixel UP1 and the second unit pixel UP2 may be arranged along the first direction X. The first unit pixel UP1 and the third unit pixel UP3 may be arranged along the second direction Y. The fourth unit pixel UP4 may be arranged along the second direction Y together with the second unit pixel UP2, and may be arranged along the first direction X together with the third unit pixel UP3. That is, the first unit pixel UP1 and the fourth unit pixel UP4 may be arranged along a diagonal direction.

Each of the unit pixels UP1 to UP4 may include a pair of divided photoelectric conversion parts. For example, the first unit pixel UP1 may include a first photoelectric conversion part PD1L and a second photoelectric conversion part PDIR, the second unit pixel UP2 may include a third photoelectric conversion part PD2U and a fourth photoelectric conversion part PD2D, the third unit pixel UP3 may include a fifth photoelectric conversion part PD3L and a sixth photoelectric conversion part PD3R, and the fourth unit pixel UP4 may include a seventh photoelectric conversion part PD4L and an eighth photoelectric conversion part PD4R.

Accordingly, each of the unit pixels UP1 to UP4 may perform an auto-focus (AF) function. Specifically, each of the unit pixels UP1 to UP4 may perform a phase detection AF (PDAF) function, using the pair of divided photoelectric conversion parts.

At least a part (e.g., the second unit pixel UP2) of the unit pixels may be divided in a direction different from the different unit pixels (e.g., the first, third and fourth unit pixels UP1, UP3 and UP4). As an example, the first unit pixel UP1 may include a first photoelectric conversion part PD1L and a second photoelectric conversion part PDIR arranged along the first direction X, and the second unit pixel UP2 may include a third photoelectric conversion part PD2U and a fourth photoelectric conversion part PD2D arranged along the second direction Y. Accordingly, the image sensor according to some embodiments may perform the auto-focus function in both the first direction X and the second direction Y.

Although the third unit pixel UP3 and the fourth unit pixel UP4 are only shown as being divided in the same direction as the first unit pixel UP1, this is only an example. As another example, at least one of the third unit pixel UP3 and the fourth unit pixel UP4 may, of course, be divided in the same direction as the first unit pixel UP1.

In some embodiments, each of the unit pixels UP1 to UP4 may include connecting parts IR1 to IR4 that connect a pair of photoelectric conversion parts. For example, the first unit pixel UP1 may include a first connecting part IR1 that connects the first photoelectric conversion part PD1L and the second photoelectric conversion part PDIR, the second unit pixel UP2 may include a second connecting part IR2 that connects the third photoelectric conversion part PD2U and the fourth photoelectric conversion part PD2D, the third unit pixel UP3 may include a third connecting part IR3 that connects the fifth photoelectric conversion part PD3L and the sixth photoelectric conversion part PD3R, and the fourth unit pixel UP4 may include a fourth connecting part IR4 that connects the seventh photoelectric conversion part PD4L and the eighth photoelectric conversion PD4R.

Each of the photoelectric conversion parts PD1L, PDIR, PD2U, PD2D PD3L, PD3R, PD4L and PD4R may include a photoelectric conversion region 112. The photoelectric conversion region 112 may include impurities of a second conductive type different from the first conductive type. In embodiments to be described later, although the second conductive type will be described as an n-type, this is merely an example, and the second conductive type may, of course, be a p-type. The photoelectric conversion region 112 may be formed, for example, by ion-implantation of n-type impurities (e.g., phosphorus (P) or arsenic (As)) into the p-type first substrate 110.

Each of the connecting parts IR1 to IR4 may not include the photoelectric conversion region 112. That is, the photoelectric conversion region 112 may be isolated inside each of the photoelectric conversion parts PD1L, PDIR, PD2U, PD2D, PD3L, PD3R, PD4L and PD4R.

In some embodiments, the photoelectric conversion region 112 may be closer to the second surface 110*b* of the first substrate 110 than the first surface 110*a* of the first substrate 110. In some embodiments, the photoelectric conversion region 112 may also have a potential slope in the third direction Z. For example, an impurity concentration of the photoelectric conversion region 112 may decrease from the second surface 100*b* toward the first surface 110*a*.

Each of the unit pixels UP1 to UP4 may be coupled with the first electronic element TR1. The first electronic element TR1 may be formed on the second surface 110*b* of the first substrate 110. The first electronic element TR1 may form various transistors connected to the photoelectric conversion parts PD1L, PDIR, PD2U, PD2D, PD3L, PD3R, PD4L and PD4R to process the electric signals. For example, the first electronic element TR1 may include the control transistors TX1, TX2, RX, SX and AX described above in the description of FIG. 2.

In some embodiments, the first electronic element TR1 may include a vertical transfer transistor. For example, at least a part of the first electronic element TR1 including the first transfer transistor TX1 and the second transfer transistor TX2 may be embedded inside the first substrate 110. The first electronic element TR1 having such a form may reduce an area of a unit pixel, which may be advantageous for a high integration of the image sensor.

The pixel isolation pattern 120 may be formed inside the first substrate 110. The pixel isolation pattern 120 may be formed in a grid shape from a planar viewpoint to define unit pixels UP1 to UP4 in the first substrate 110. For example, as shown in FIG. 6, the pixel isolation pattern 120 may include a first isolation part 120*a* and a second isolation part 120*b*. The first isolation part 120*a* extends in the first direction X, and may define one side surface of each of the unit pixels UP1 to UP4. The second isolation part 120*b* extends in the second direction Y and may define another side surface of each of the unit pixels UP1 to UP4. The pixel isolation pattern 120 may surround each of the unit pixels UP1 to UP4.

The pixel isolation pattern 120 may be formed by embedding an insulating material inside a deep trench formed in the first substrate 110. The pixel isolation pattern 120 may include, but is not limited to, for example, at least one of silicon oxide, silicon nitride, silicon oxynitride, aluminum oxide, hafnium oxide, and a combination thereof.

Sizes (L11 and L12 of FIG. 6) of each of the unit pixels UP1 to UP4 defined by the pixel isolation pattern 120 may be, for example, about 0.3 μm to about 3.0 μm. In some embodiments, the sizes L11 and L12 of each of the unit pixels UP1 to UP4 may be about 0.9 μm to about 1.5 μm. In each of the unit pixels UP1 to UP4, although the length L11 in the first direction X and the length L12 in the second direction Y are only shown as being the same as each other, this is merely an example, and the lengths may, of course, differ from each other.

Widths (W11 and W12 of FIG. 6) of the pixel isolation pattern 120 may be, for example, about 10 nm to about 500 nm. In some embodiments, the widths W11 and W12 of the pixel isolation pattern 120 may be about 100 nm to about 400 nm. Although the width W12 of the first isolation part 120*a* and the width W11 of the second isolation part 120*b* are only shown as being the same as each other, this is merely an example, and the widths may, of course, differ from each other.

In some embodiments, the widths W11 and W12 of the pixel isolation pattern 120 may decrease from the second surface 110*b* of the first substrate 110 toward the first surface 110*a* of the first substrate 110. For example, as shown in FIGS. 4 and 5, the side surface of the pixel isolation pattern 120 may form an acute angle with the second surface 110*b* of the first substrate 110, and may form an obtuse angle with the first surface 110*a* of the first substrate 110. This may be due to the fact that an etching process for forming the deep trench for the pixel isolation pattern 120 is performed on the second surface 110*b* of the first substrate 110. That is, the pixel isolation pattern 120 may be a FDTI (frontside deep trench isolation) formed by a DTI process on the front side of the first substrate 110.

In some embodiments, the pixel isolation pattern 120 may extend continuously from the second surface 110*b* of the first substrate 110 to the first surface 110*a* of the first substrate 110. For example, the depth of the pixel isolation pattern 120 in the third direction Z may be about 5000 nm to about 6,000 nm.

The first separation patterns 122*a* and 122*b* may be formed inside the first substrate 110. The first separation patterns 122*a* and 122*b* may define unit pixels (e.g., first, third and fourth unit pixels UP1, UP3 and UP4) divided in the first direction X. For example, the first separation patterns 122*a* and 122*b* may be interposed between the first photoelectric conversion part PD1L and the second photoelectric conversion part PDIR. The first separation patterns 122*a* and 122*b* extend in the second direction Y, and may separate the first photoelectric conversion part PD1L and the second photoelectric conversion part PDIR.

In some embodiments, the first separation patterns 122*a* and 122*b* may protrude from the side surface of the pixel isolation pattern 120. For example, as shown in FIG. 6, the first separation patterns 122*a* and 122*b* may protrude in the second direction Y from the side surface of the first isolation part 120*a* of the pixel isolation pattern 120.

In some embodiments, the first separation patterns 122*a* and 122*b* may include a first sub-separation pattern 122*a* and a second sub-separation pattern 122*b* that are spaced apart from each other in the second direction Y. For example, the first sub-separation pattern 122*a* may protrude from one side surface of the pixel isolation pattern 120, and the second sub-separation pattern 122*b* may protrude from the other side surface opposite to the one side surface of the pixel isolation pattern 120. The first sub-separation pattern 122*a* and the second sub-separation pattern 122*b* may be opposite to each other. In such a case, the first connecting part IR1 that connects the first photoelectric conversion part PD1L and the second photoelectric conversion part PDIR may be defined between the first sub-separation pattern 122*a* and the second sub-separation pattern 122*b*. That is, the first separation patterns 122*a* and 122*b* may define "H" type unit pixels (e.g., first, third and fourth unit pixels UP1, UP3 and UP4).

The width (W21 of FIG. 6) of the first separation patterns 122*a* and 122*b* may be, for example, about 10 nm to about 500 nm. In some embodiments, a width W21 of the first separation patterns 122*a* and 122*b* may be about 100 nm to about 400 nm. Although the width of the first sub-separation pattern 122*a* and the width of the second sub-separation pattern 122*b* are only shown as being the same as each other, this is merely an example, and the widths may, of course, differ from each other. Also, although the width W21 of the first separation patterns 122*a* and 122*b* are only shown as being the same as the widths W11 and W12 of the pixel isolation pattern 120, this is also merely an example.

A length L21 of the first sub-separation pattern 122*a* and the second sub-separation pattern 122*b* protruding from the pixel isolation pattern 120 may be smaller than a length L12 of the first unit pixel UP1 in the second direction Y. The length L21 of each of the first sub-separation pattern 122*a* and the second sub-separation pattern 122*b* protruding from the pixel isolation pattern 120 may be, for example, about 100 nm to about 1,000 nm. In some embodiments, the protruding length L21 of each of the first sub-separation pattern 122*a* and the second sub-separation pattern 122*b* may be about 200 nm to about 500 nm.

A spaced distance D11 between the first sub-separation pattern 122*a* and the second sub-separation pattern 122*b* may be, for example, about 100 nm to about 1,000 nm. In some embodiments, the spaced distance D11 between the first sub-separation pattern 122*a* and the second sub-separation pattern 122*b* may be about 200 nm to about 500 nm.

The second separation patterns 124*a* and 124*b* may be formed inside the first substrate 110. The second separation patterns 124*a* and 124*b* may define a unit pixel (e.g., a second unit pixel UP2) divided in the second direction Y. For example, the second separation patterns 124*a* and 124*b* may be interposed between the third photoelectric conversion part PD2U and the fourth photoelectric conversion part PD2D. The second separation patterns 124*a* and 124*b* extend in the first direction X, and may separate the third photoelectric conversion part PD2U and the fourth photoelectric conversion part PD2D.

In some embodiments, the second separation patterns 124*a* and 124*b* may protrude from the side surface of the pixel isolation pattern 120. For example, as shown in FIG. 6, the second separation patterns 124*a* and 124*b* may protrude from the side surface of the second isolation part 120*b* of the pixel isolation pattern 120 in the first direction X.

In some embodiments, the second separation patterns 124*a* and 124*b* may include a third sub-separation pattern 124*a* and a fourth sub-separation pattern 124*b* spaced apart from each other in the first direction X. For example, the third sub-separation pattern 124*a* may protrude from one side surface of the pixel isolation pattern 120, and the fourth sub-separation pattern 124*b* may protrude from the other side surface opposite to the one side surface of the pixel isolation pattern 120. The third sub-separation pattern 124*a* and the fourth sub-separation pattern 124*b* may be opposite to each other. In such a case, the second connecting part IR2 that connects the third photoelectric conversion part PD2U and the fourth photoelectric conversion part PD2D may be defined between the third sub-separation pattern 124*a* and the fourth sub-separation pattern 124*b*. That is, the second separation patterns 124*a* and 124*b* may define an "I" type unit pixel (for example, a second unit pixel UP2).

A width (W22 of FIG. 6) of the second separation patterns 124*a* and 124*b* may be, for example, about 10 nm to about 500 nm. In some embodiments, the width W22 of the second separation patterns 124*a* and 124*b* may be about 100 nm to about 400 nm. Although the width of the third sub-separation pattern 124*a* and the width of the fourth sub-separation pattern 124*b* are only shown as being the same as each other, this is merely an example, and the widths may, of course, differ from each other. Also, although the width W22 of the second separation patterns 124*a* and 124*b* is only shown as being the same as the width W21 of the first separation patterns 122*a* and 122*b*, this is merely an example, and the widths may, of course, differ from each other.

A length L22 of the third sub-separation pattern 124*a* and the fourth sub-separation pattern 124*b* protruding from the pixel isolation pattern 120 may be smaller than the length L11 of the second unit pixel UP2 in the first direction X. The length L22 of the third sub-separation pattern 124*a* and the fourth sub-separation pattern 124*b* each protruding from the pixel isolation pattern 120 may be, for example, about 100 nm to about 1,000 nm. In some embodiments, the protruding length L22 of each of the third sub-separation pattern 124*a* and the fourth sub-separation pattern 124*b* may be about 200 nm to about 500 nm. Although the protruding length L22 of each of the third sub-separation pattern 124*a* and the fourth sub-separation pattern 124*b* is only shown as being the same as the protruding length L21 of the first sub-separation pattern 122*a* and the second sub-separation pattern 122*b*, this is merely an example, and the lengths may, of course, differ from each other.

A spaced distance D12 between the third sub-separation pattern 124*a* and the fourth sub-separation pattern 124*b* may be, for example, about 100 nm to about 1,000 nm. In some embodiments, the spaced distance D12 between the third sub-separation pattern 124*a* and the fourth sub-separation pattern 124*b* may be about 200 nm to about 500 nm. Although the spaced distance D12 between the third sub-separation pattern 124*a* and the fourth sub-separation pattern 124*b* is only shown as being the same as the spaced distance D11 between the first sub-separation pattern 122*a* and the second sub-separation pattern 122*b*, this is merely an example, and the distances may, of course, differ from each other.

The first separation patterns 122*a* and 122*b* and the second separation patterns 124*a* and 124*b* may each be formed by embedding an insulating material inside the deep trench formed in the first substrate 110. The first separation patterns 122*a* and 122*b* and the second separation patterns 124*a* and 124*b* may include, but are not limited to, for example, at least one of silicon oxide, silicon nitride, silicon oxynitride, aluminum oxide, hafnium oxide, and a combination thereof.

In some embodiments, the width W21 of the first separation patterns 122*a* and 122*b* and the width W22 of the second separation patterns 124*a* and 124*b* may decrease from the second surface 110*b* of the first substrate 110 toward the first surface 110*a* of the first substrate 110. For example, as shown in FIG. 4, the side surface of the first sub-separation pattern 122*a* may form an acute angle with the second surface 110*b* of the first substrate 110, and may form an obtuse angle with the first surface 110*a* of the first substrate 110. This may be caused by the fact that the etching process for forming the deep trench for the first separation patterns 122*a* and 122*b* and the second separation patterns 124*a* and 124*b* is performed on the second surface 110*b* of the first substrate 110. That is, the first separation patterns 122*a* and 122*b* and the second separation patterns 124*a* and

124*b* may each be a FDTI formed by a DTI process on the front side of the first substrate 110.

In some embodiments, the first separation patterns 122*a* and 122*b* and the second separation patterns 124*a* and 124*b* may extend continuously from the second surface 110*b* of the first substrate 110 to the first surface 110*a* of the first substrate 110. For example, the depth of the first separation patterns 122*a* and 122*b* and the depth of the second separation patterns 124*a* and 124*b* in the third direction Z may be about 5000 nm to about 6,000 nm.

In some embodiments, the first separation patterns 122*a* and 122*b* and the second separation patterns 124*a* and 124*b* may be formed at the same level as the pixel isolation pattern 120. As used herein, the expression "formed at the same level" means formation by the same manufacturing process. For example, the material compositions of the first separation patterns 122*a* and 122*b* and the second separation patterns 124*a* and 124*b* may be the same as the material composition of the pixel isolation pattern 120.

The first wiring structure IS1 may be formed on the second surface 110*b* of the first substrate 110. The first wiring structure IS1 may extend along the second surface 110*b* of the first substrate 110. The first wiring structure IS1 may be made up of one or multiple wirings. For example, the first wiring structure IS1 may include a first inter-wiring insulating film 130, and a plurality of first wirings 132 inside the first inter-wiring insulating film 130. In FIGS. 4 and 5, the number of layers and the arrangement of the wirings constituting the first wiring structure IS1 are merely an example, and the present disclosure is not limited thereto.

In some embodiments, the first wiring 132 may be electrically connected to the unit pixels UP1 to UP4. For example, the first wiring 132 may be connected to the first electronic element TR1.

The surface insulating film 140 may be formed on the first surface 110*a* of the first substrate 110. The surface insulating film 140 may extend along the first surface 110*a* of the first substrate 110. The surface insulating film 140 may include an insulating material. For example, the surface insulating film 140 may include, but is not limited to, at least one of silicon oxide, silicon nitride, silicon oxynitride, aluminum oxide, hafnium oxide, and a combination thereof.

In some embodiments, the surface insulating film 140 may be formed of multi-films. For example, unlike the shown embodiment, the surface insulating film 140 may include an aluminum oxide film, a hafnium oxide film, a silicon oxide film, a silicon nitride film and a hafnium oxide film that are sequentially stacked on the first surface 110*a* of the first substrate 110.

The surface insulating film 140 may function as an antireflection film to limit and/or prevent reflection of light that is incident on the first substrate 110. The light-receiving rate of the photoelectric conversion region 112 may be improved accordingly. Further, the surface insulating film 140 may function as a flattening film, which may contribute to formation of color filters 170*a* and 170*b* and a microlens 180 to be described later at a uniform height.

The color filters 170*a* and 170*b* may be formed on the surface insulating film 140. The color filters 170*a* and 170*b* may be arranged to correspond to the unit pixels UP1 to UP4. That is, the plurality of color filters 170*a* and 170*b* may be arranged two-dimensionally (for example, in the form of a matrix) in a plane including the first direction X and the second direction Y. As an example, the filters 170*a* and 170*b* may include a first color filter 170*a* corresponding to the first unit pixel UP1, and a second color filter 170*b* corresponding to the second unit pixel UP2.

The color filters 170*a* and 170*b* may have various colors depending on the unit pixels UP1 to UP4. For example, the color filters 170*a* and 170*b* may include a red color filter, a green color filter, a blue color filter, a yellow filter, a magenta filter and a cyan filter, and further include a white filter.

In some embodiments, unit pixels adjacent to each other (e.g., the first unit pixel UP1 and the second unit pixel UP2) may detect light of the same color as each other (e.g., light of the same wavelength band). For example, the first color filter 170*a* and the second color filter 170*b* may include color filters of the same color as each other. As an example, both the first color filter 170*a* and the second color filter 170*b* may be a green color filter. In such a case, both the first unit pixel UP1 and the second unit pixel UP2 may detect light of the green wavelength band.

In some embodiments, grid patterns 150 and 160 may be formed on the surface insulating film 140. The grid patterns 150 and 160 are formed in a grid shape from a planar viewpoint, and may be interposed between the color filters 170*a* and 170*b*. In some embodiments, the grid patterns 150 and 160 may be arranged to overlap the pixel isolation pattern 120 in the third direction Z.

In some embodiments, the grid patterns 150 and 160 may include a metal pattern 150 and a low refractive index pattern 160. The metal pattern 150 and the low refractive index pattern 160 may be sequentially stacked on, for example, the surface insulating film 140.

The metal pattern 150 may include, but is not limited to, for example, at least one of titanium (Ti), titanium nitride (TiN), tantalum (Ta), tantalum nitride (TaN), tungsten (W), aluminum (Al), copper (Cu), and combinations thereof. The metal pattern 150 may limit and/or prevent the electric charges generated by an ESD (electrostatic discharge) or the like from accumulating on the surface (for example, the first surface 110*a*) of the first substrate 110, thereby effectively limiting and/or preventing an ESD bruise defect. The ESD bruise defect means a phenomenon in which the electric charges generated by the ESD or the like are accumulated on the surface (e.g., the first surface 110*a*) of the first substrate 100 to cause a stain such as a bruise on the generated image.

The low refractive index pattern 160 may include a low refractive index material having a refractive index lower than that of silicon (Si). For example, the low refractive index pattern 160 may include, but is not limited to, at least one of silicon oxide, aluminum oxide, tantalum oxide, and a combination thereof. The low refractive index pattern 160 may improve the light concentration efficiency by refracting or reflecting obliquely incident light, thereby improving the quality of the image sensor.

In some embodiments, a first protective film 165 may be further formed on the surface insulating film 140 and the grid patterns 150 and 160. For example, the first protective film 165 may extend conformally along the profiles of the upper surface of the surface insulating film 140, and the side surfaces and the upper surfaces of the grid patterns 150 and 160.

The first protective film 165 may include, but is not limited to, for example, aluminum oxide. The first protective film 165 may limit and/or prevent damage to the surface insulating film 140 and the grid patterns 150 and 160.

The microlens 180 may be formed on the color filters 170*a* and 170*b*. The microlens 180 may be arranged to correspond to the unit pixels UP1 to UP4. For example, a plurality of microlenses 180 may be arranged two-dimensionally (for example, in the form of a matrix) in a plane including the first direction X and the second direction Y.

The microlens 180 has a convex shape, and may have a desired and/or alternatively predetermined radius of curvature. The microlens 180 may concentrate light that is incident on the photoelectric conversion region 112 accordingly. The microlens 180 may include, but is not limited to, for example, a light-transmitting resin.

In some embodiments, a second protective film 185 may be further formed on the microlens 180. The second protective film 185 may extend along the surface of the microlens 180. The second protective film 185 may include, for example, an inorganic oxide film. For example, the second protective film 185 may include, but is not limited to, at least one of silicon oxide, titanium oxide, zirconium oxide, hafnium oxide, and a combination thereof. In some embodiments, the second protective film 185 may include a low temperature oxide (LTO).

The second protective film 185 may protect the microlens 180 from outside. For example, the second protective film 185 may protect the microlens 180 including an organic material, by including an inorganic oxide film. Further, the second protective film 185 may improve the quality of the image sensor by improving the light concentration efficiency of the microlens 180. For example, the second protective film 185 may fill the space between the microlenses 180, thereby reducing reflection, refraction, scattering or the like of the incident light that reaches the space between the microlenses 180.

The image sensor according to some embodiments may have an improved auto-focus function by including unit pixels divided in different directions from each other. As an example, as described above, the first unit pixel UP1 may include a first photoelectric conversion part PD1L and a second photoelectric conversion part PDIR arranged along the first direction X. The second unit pixel UP2 may include a third photoelectric conversion part PD2U and a fourth photoelectric conversion part PD2D arranged along the second direction Y. Accordingly, the image sensor according to some embodiments may perform the auto-focus function in both the horizontal direction (for example, the first direction X) and the vertical direction (for example, the second direction Y).

Also, an image sensor including unit pixels divided in different directions may be implemented by the first separation patterns 122*a* and 122*b* and the second separation patterns 124*a* and 124*b*. As mentioned above, the first separation patterns 122*a* and 122*b* and the second separation patterns 124*a* and 124*b* may be a FDTI formed by the DTI process on the front side of the first substrate 110. Since the FDTI may be implemented concisely without an addition of a process in a backside illumination image sensor, it is possible to provide an image sensor having improved auto-focus function by a concise structure and process.

Figure 7:
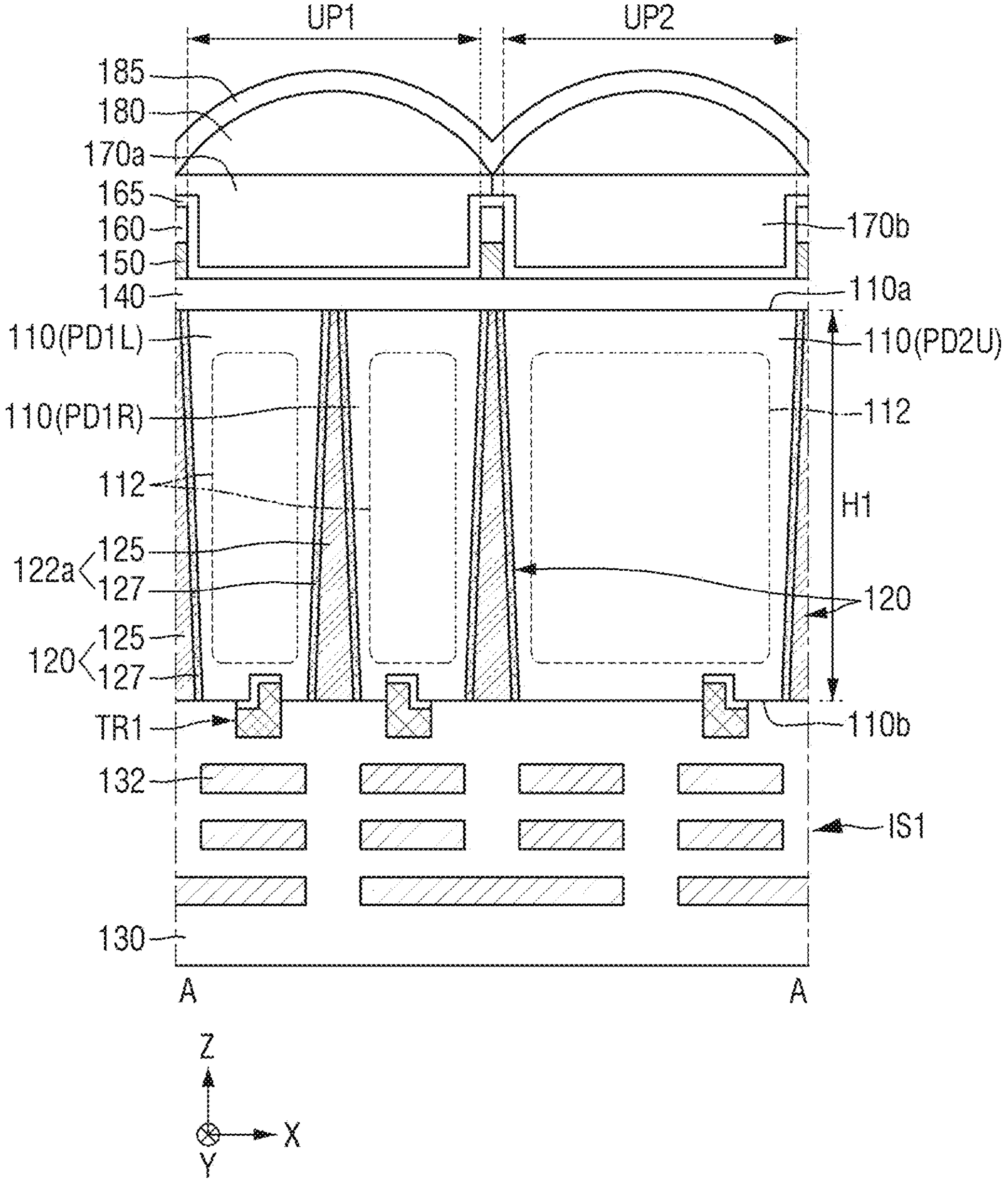
FIG. 7 is another schematic cross-sectional view taken along A-A of FIG. 3.
Figure 8:
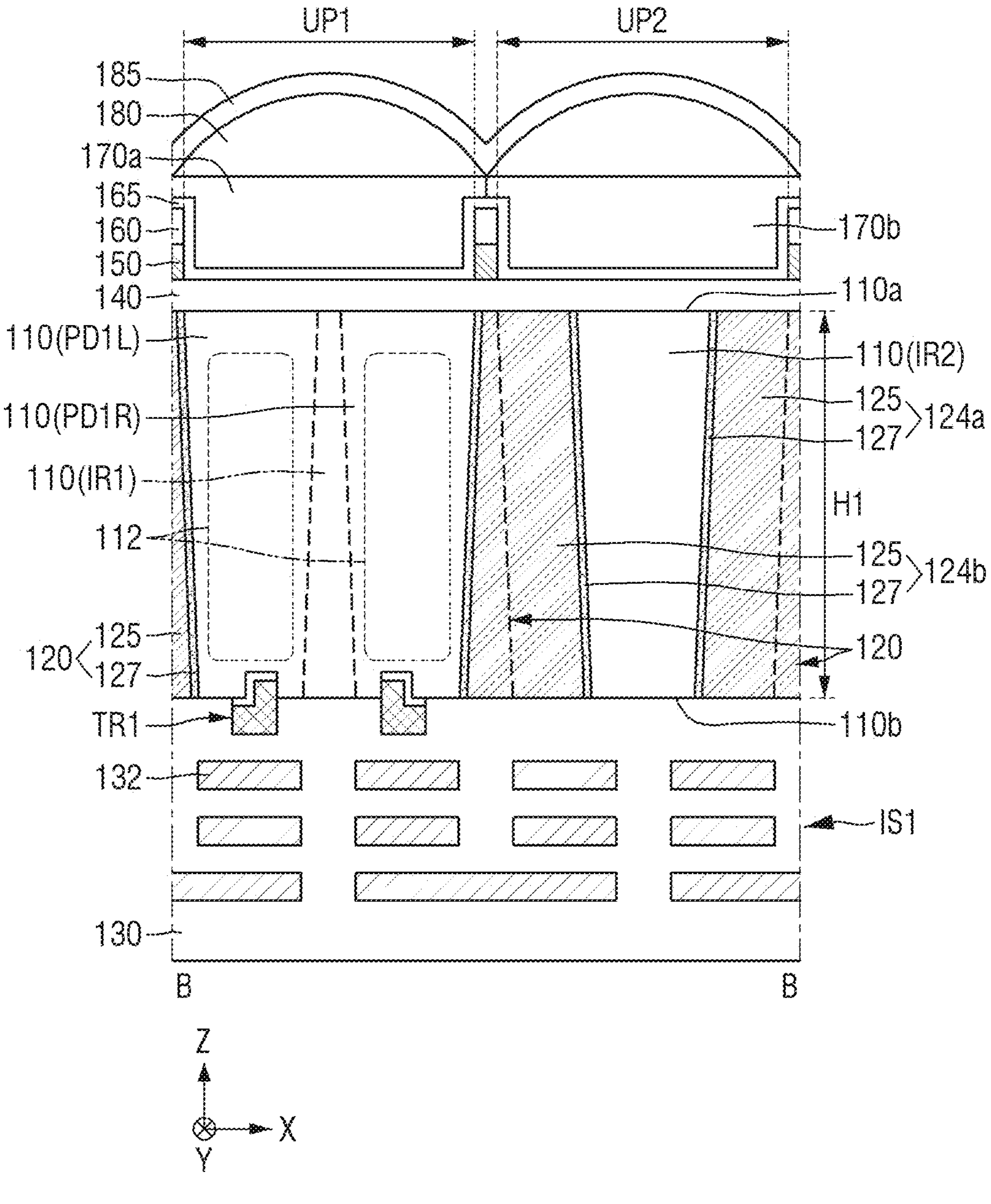
FIG. 8 is another schematic cross-sectional view taken along B-B of FIG. 3.

FIG. 7 is another schematic cross-sectional view taken along A-A of FIG. 3. FIG. 8 is another schematic cross-sectional view taken along B-B of FIG. 3. For convenience of explanation, repeated parts of contents explained above using FIGS. 1 to 6 will be briefly described or omitted.

Referring to FIGS. 3, 7 and 8, in the image sensor according to some embodiments, the pixel isolation pattern 120, the first separation patterns 122*a* and 122*b*, and the second separation patterns 124*a* and 124*b* may each include a filling pattern 125 and an insulating spacer 127.

For example, trenches for embedding the pixel isolation pattern 120, the first separation patterns 122*a* and 122*b*, and the second separation patterns 124*a* and 124*b* may be formed inside the first substrate 110. The insulating spacer 127 may conformally extend along the side surfaces of the trenches. The filling pattern 125 is formed on the insulating spacer 127 and may fill at least a part of the trenches. The insulating spacer 127 extends along the side surface of the filling pattern 125 and may separate the filling pattern 125 from the first substrate 110.

In some embodiments, the filling pattern 125 may include a conductive material. The filling pattern 125 may include, but is not limited to, for example, polysilicon (poly Si). In some embodiments, a ground voltage or a negative voltage may be applied to the filling pattern 125 including the conductive material. In such a case, ESD bruising defects of the image sensor according to some embodiments may be effectively limited and/or prevented.

The insulating spacer 127 may electrically insulate the filling pattern 125 from the first substrate 110. The insulating spacer 127 may include, but is not limited to, for example, at least one of silicon oxide, aluminum oxide, tantalum oxide, and a combination thereof.

In some embodiments, the insulating spacer 127 may include an oxide having a lower refractive index than the first substrate 110. The insulating spacer 127 having a lower refractive index than the first substrate 110 may refract or reflect light that is obliquely incident on the photoelectric conversion region 112. Further, the insulating spacer 127 may limit and/or prevent the photocharges generated in a specific unit pixel (e.g., the first unit pixel UP1) by the incident light from moving to the another adjacent unit pixel (e.g., the second unit pixel UP2) by a random drift. That is, the insulating spacer 127 may improve the light-receiving rate of the photoelectric conversion region 112 to improve the quality of the image sensor.

FIGS. 9A to 9F are various layout diagrams for explaining the unit pixels of the image sensor according to some embodiments. FIGS. 9A to 9F show various image sensors that include unit pixels divided in different directions from each other. For convenience of explanation, repeated parts of contents explained above using FIGS. 1 to 6 will be briefly described or omitted.

Figure 9A:
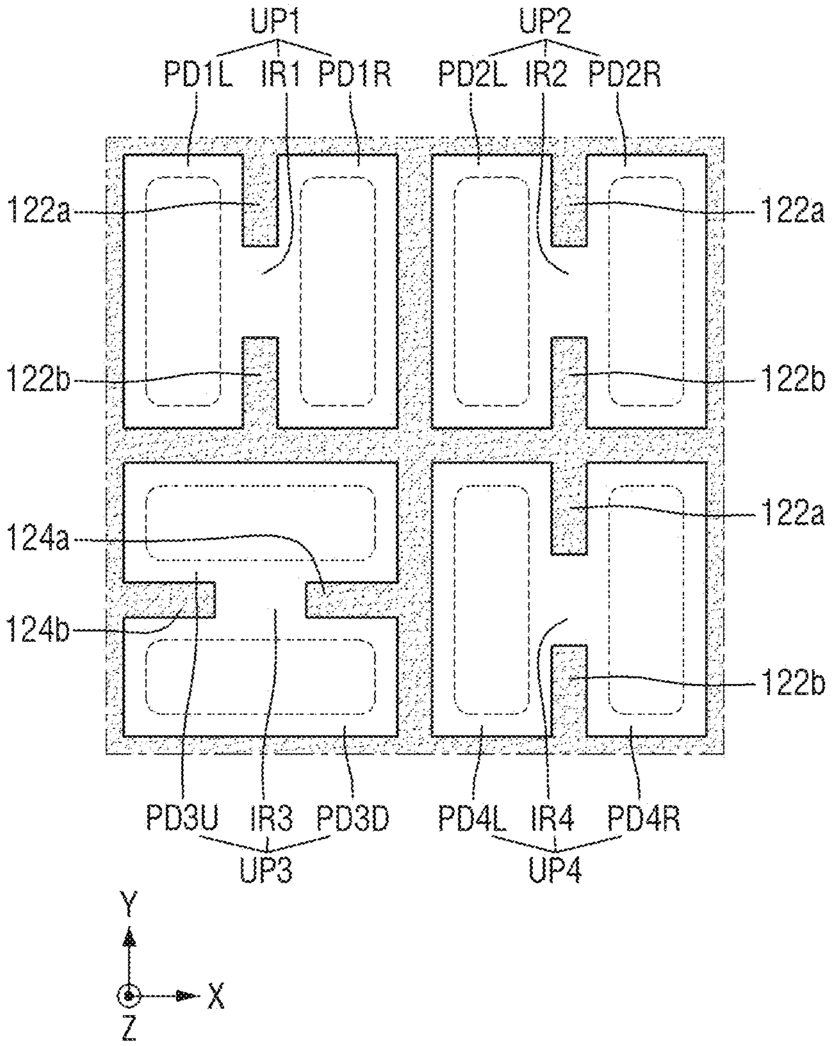
FIGS. 9A to 9F are various layout diagrams for explaining the unit pixels of the image sensor according to some embodiments.

Specifically, referring to FIG. 9A, the image sensor according to some embodiments includes first, second and fourth unit pixels UP1, UP2 and UP4 divided in the first direction X, and a third unit pixel UP3 divided in the second direction Y.

For example, unlike the image sensor of FIG. 3, the second unit pixel UP2 may include a third photoelectric conversion part PD2L and a fourth photoelectric conversion part PD2R arranged along the first direction X. Such a second unit pixel UP2 may be defined by the first separation patterns 122*a* and 122*b*.

Further, unlike the image sensor of FIG. 3, the third unit pixel UP3 may include a fifth photoelectric conversion part PD3U and a sixth photoelectric conversion part PD3D arranged along the second direction Y. Such a third unit pixel UP3 may be defined by the second separation patterns 124*a* and 124*b*.

Figure 9B:
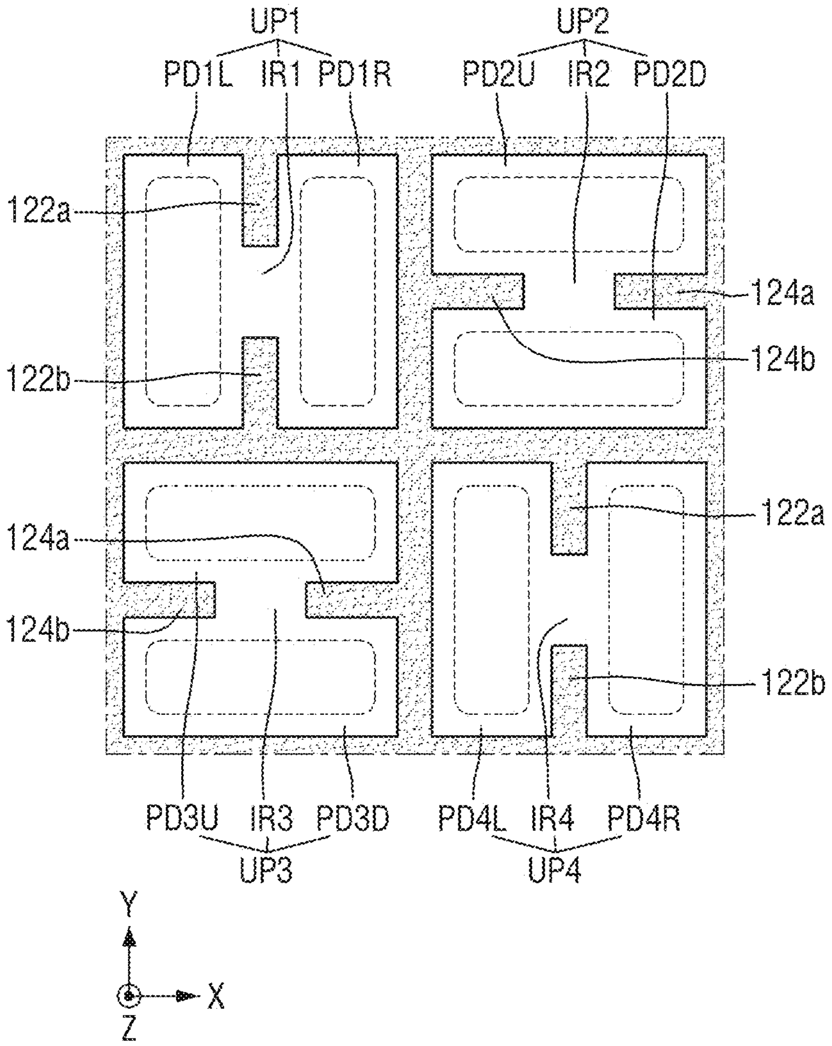

Referring to FIG. 9B, an image sensor according to some embodiments includes first and fourth unit pixels UP1 and UP4 divided in the first direction X, and second and third unit pixels UP2 and UP3 divided in the second direction Y.

For example, unlike the image sensor of FIG. 9A, the second unit pixel UP2 may include a third photoelectric conversion part PD2U and a fourth photoelectric conversion part PD2D arranged along the second direction Y. Such a second unit pixel UP2 may be defined by the second separation patterns 124*a* and 124*b*.

Figure 9C:
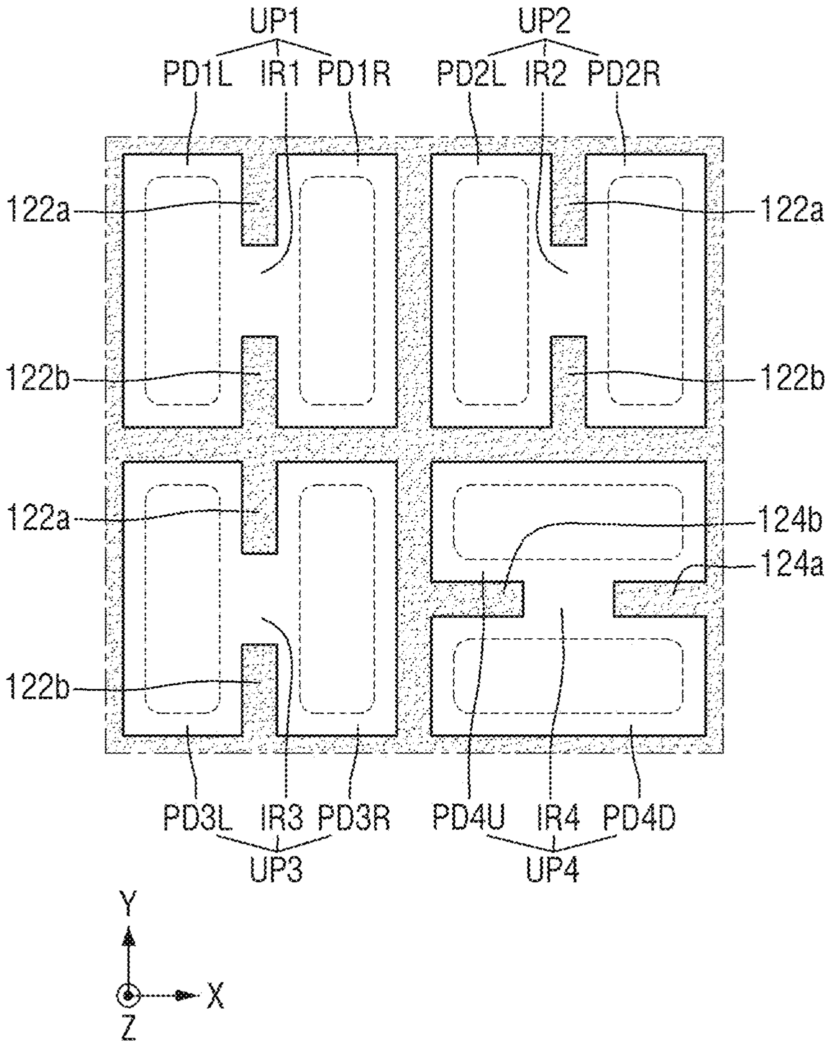

Referring to FIG. 9C, an image sensor according to some embodiments includes first, second and third unit pixels UP1, UP2 and UP3 divided in the first direction X, and a fourth unit pixel UP4 divided in the second direction Y.

For example, unlike the image sensor of FIG. 3, the second unit pixel UP2 may include a third photoelectric conversion part PD2L and a fourth photoelectric conversion part PD2R arranged along the first direction X. Such a second unit pixel UP2 may be defined by the first separation patterns 122*a* and 122*b*.

Also, unlike the image sensor of FIG. 3, the fourth unit pixel UP4 may include a seventh photoelectric conversion part PD4U and an eighth photoelectric conversion part PD4D arranged along the second direction Y. Such a fourth unit pixel UP4 may be defined by the second separation patterns 124*a* and 124*b*.

Figure 9D:
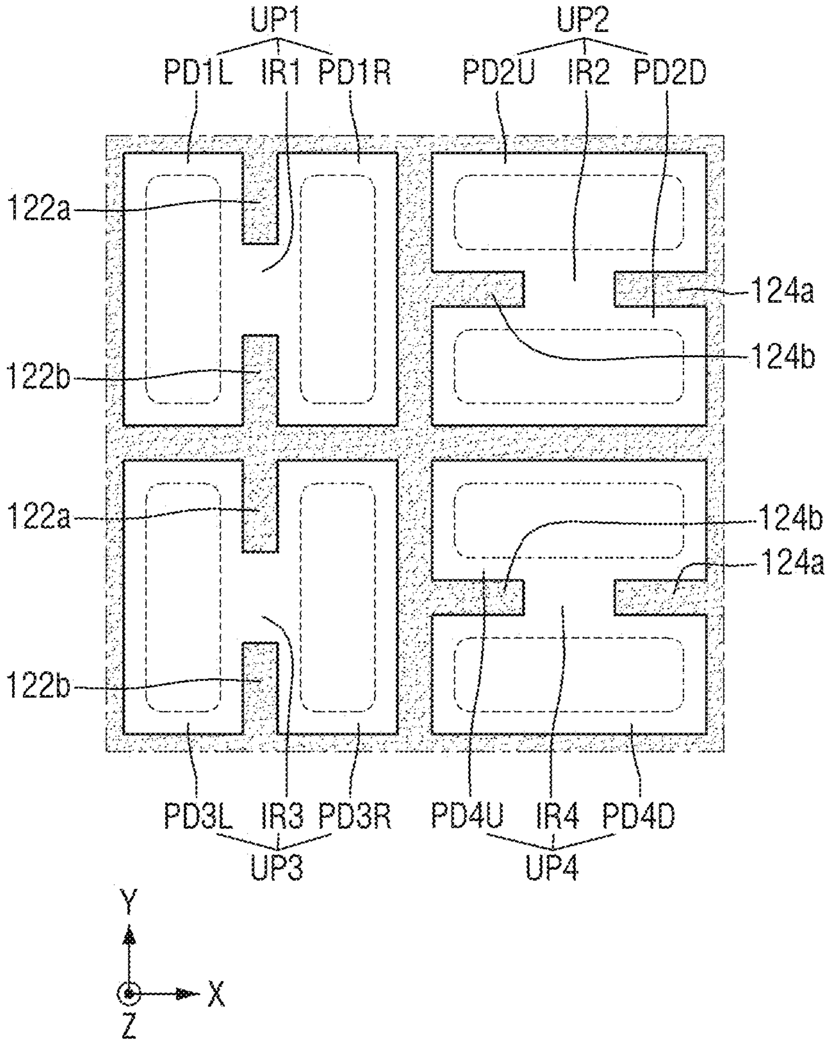

Referring to FIG. 9D, the image sensor according to some embodiments includes first and third unit pixels UP1 and UP3 divided in the first direction X, and second and fourth unit pixels UP2 and UP4 divided in the second direction Y.

For example, unlike the image sensor of FIG. 9C, the second unit pixel UP2 may include a third photoelectric conversion part PD2U and a fourth photoelectric conversion part PD2D arranged along the second direction Y. Such a second unit pixel UP2 may be defined by the second separation patterns 124*a* and 124*b*.

Figure 9E:
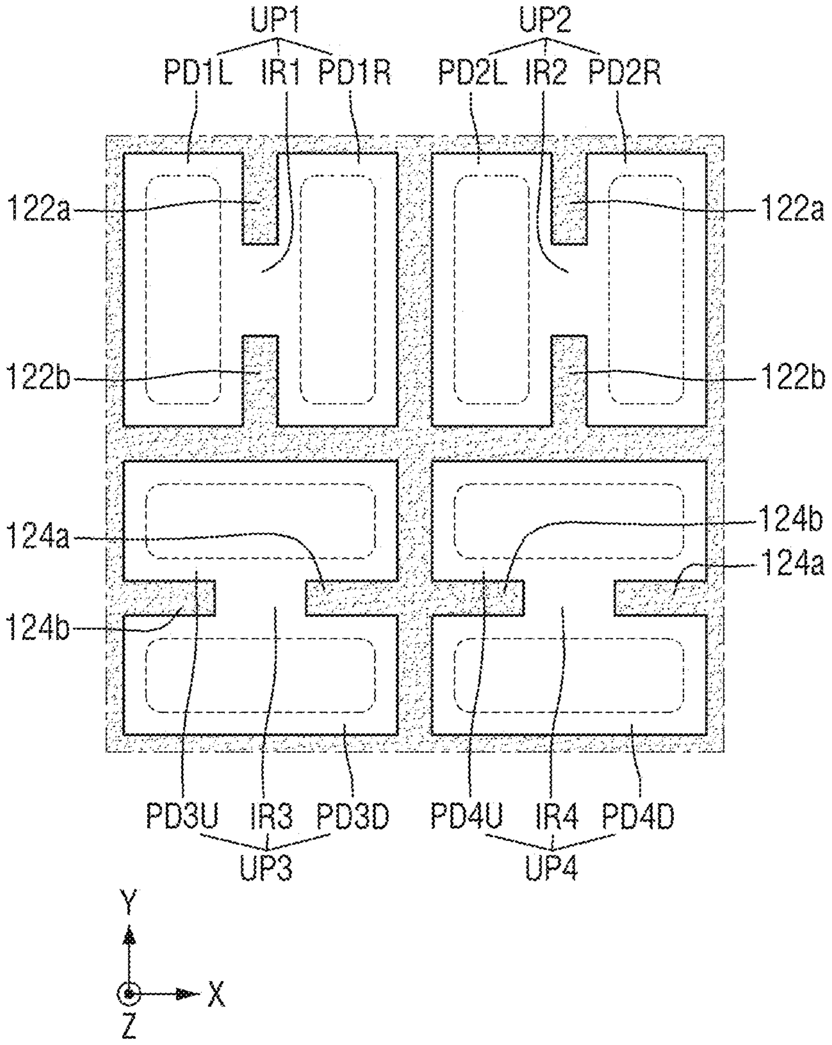

Referring to FIG. 9E, an image sensor according to some embodiments includes first and second unit pixels UP1 and UP2 divided in the first direction X, and third and fourth unit pixels UP3 and UP4 divided in the second direction Y.

For example, unlike the image sensor of FIG. 9C, the third unit pixel UP3 may include a fifth photoelectric conversion part PD3U and a sixth photoelectric conversion part PD3D arranged along the second direction Y. Such a third unit pixel UP3 may be defined by the second separation patterns 124*a* and 124*b*.

Figure 9F:
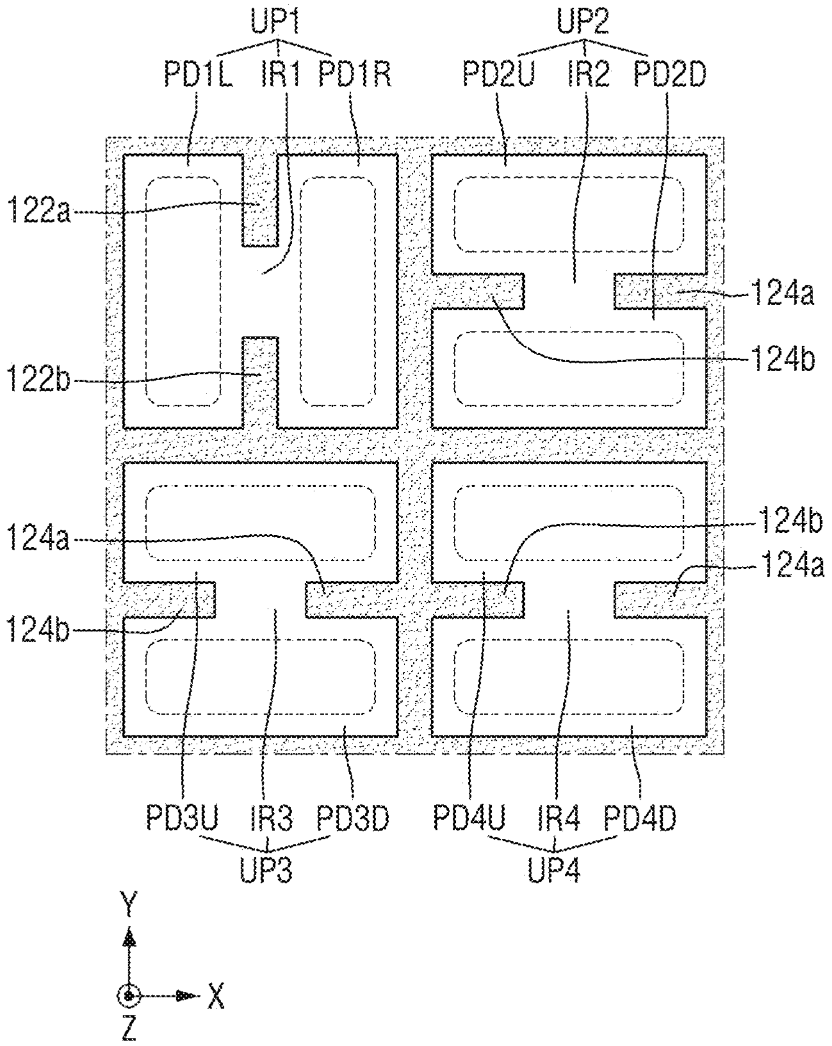

Referring to FIG. 9F, an image sensor according to some embodiments may include a first unit pixel UP1 divided in the first direction X, and the second, third and fourth unit pixels UP2, UP3 and UP4 divided in the second direction Y.

For example, unlike the image sensor of FIG. 9E, the second unit pixel UP2 may include a third photoelectric conversion part PD2U and a fourth photoelectric conversion part PD2D arranged along the second direction Y. Such a second unit pixel UP2 may be defined by the second separation patterns 124*a* and 124*b*.

Figure 10:
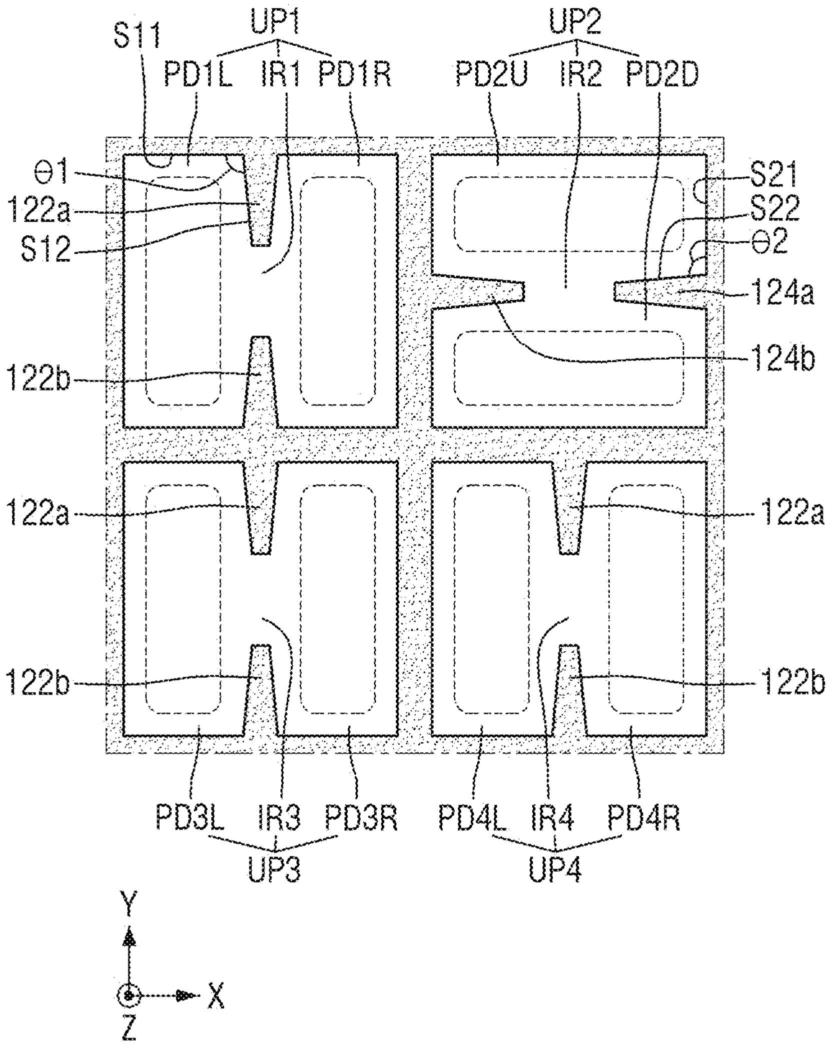
FIGS. 10 to 12 are various layout diagrams for explaining the unit pixels of the image sensor according to some embodiments.
Figure 11:
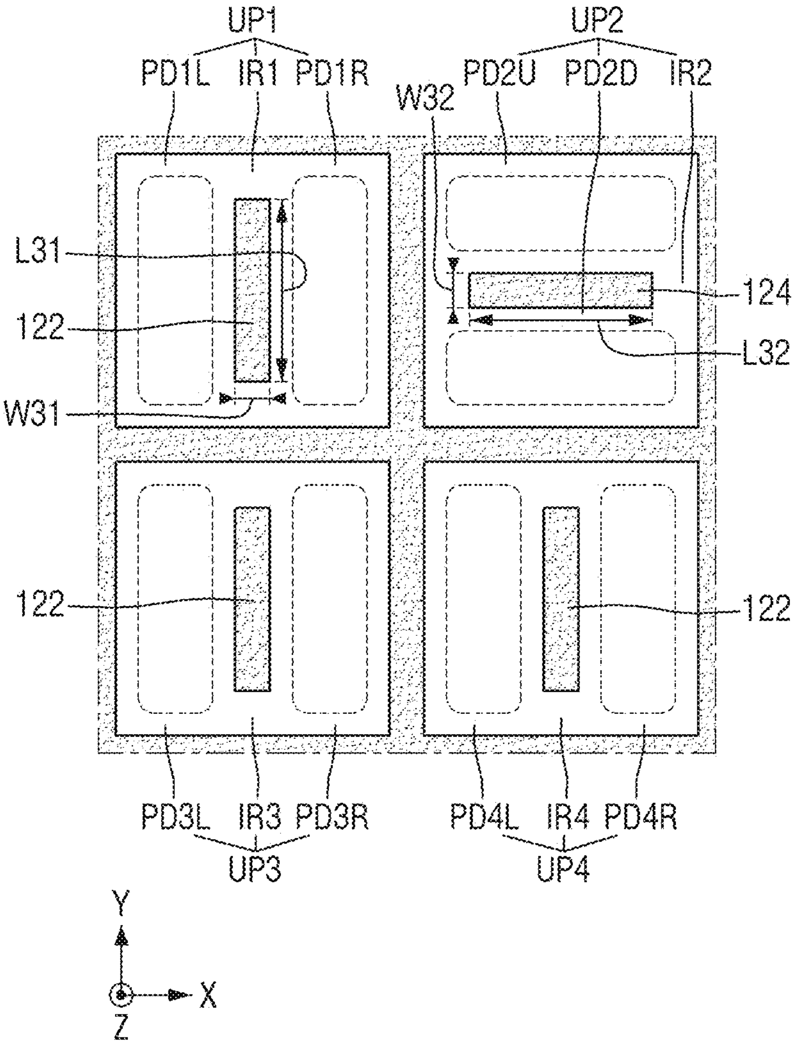
Figure 12:
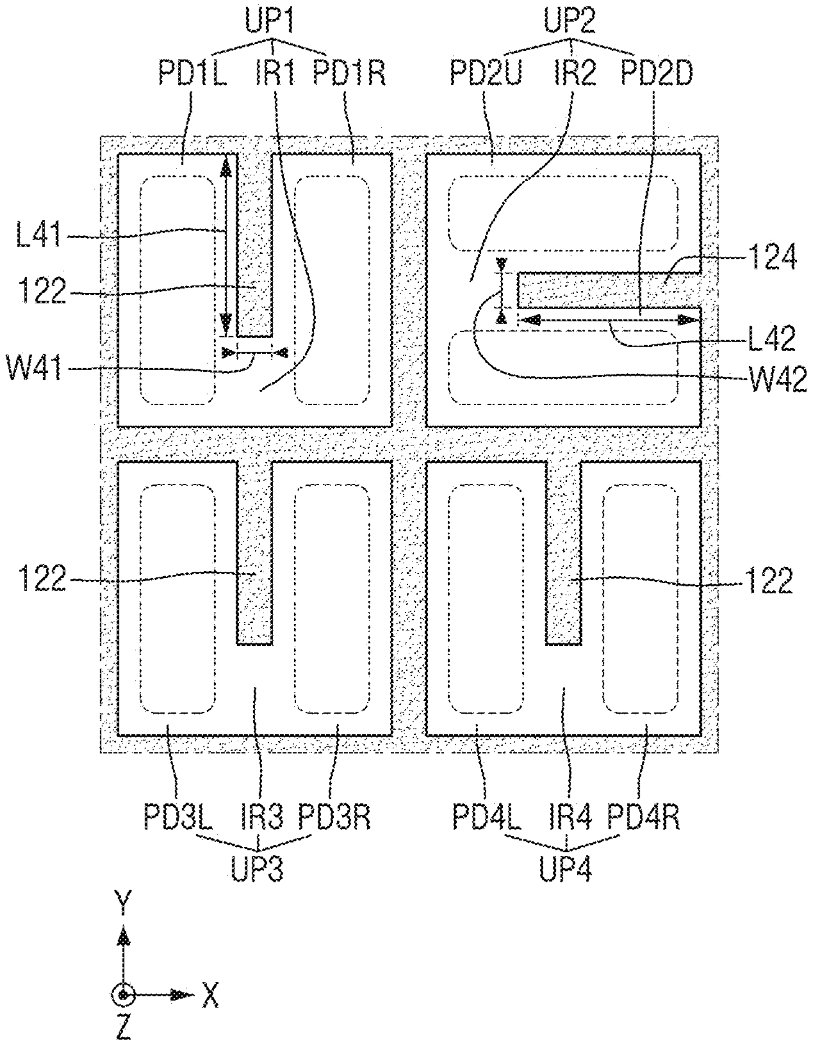

FIGS. 10 to 12 are various layout diagrams for explaining the unit pixels of the image sensor according to some embodiments. For convenience of explanation, repeated parts of contents explained above using FIGS. 1 to 9F will be briefly explained or omitted.

Referring to FIG. 10, in the image sensor according to some embodiments, each of the first separation patterns 122*a* and 122*b* and the second separation patterns 124*a* and 124*b* form desired and/or alternatively predetermined angles θ1 and 02*a* with the pixel isolation pattern 120.

For example, the pixel isolation pattern 120 may include a first side surface S11 extending in the first direction X, and a second side surface S21 extending in the second direction Y. The first sub-separation pattern 122*a* may include a third side surface S12 extending from the first side surface S11, and the third sub-separation pattern 124*a* may include a fourth side surface S22 extending from the second side surface S21.

At this time, the first side surface S11 of the pixel isolation pattern 120 may form a first angle θ1 with the third side surface S12 of the first sub-separation pattern 122*a*, and the second side surface S21 of the pixel isolation pattern 120 may form a second angle θ2 with the fourth side surface S22 of the third sub-separation pattern 124*a*. Each of the first angle θ1 and the second angle θ2 may be, for example, about 45° to about 135°. In some embodiments, each of the first angle θ1 and the second θ2 may be about 85° to about 95°. Although the first angle θ1 and the second angle θ2 are only shown as being the same as each other, this is merely an example, and the angles may, of course, differ from each other.

In some embodiments, the first angle θ1 and/or each of the second θ2 may be an obtuse angle. In such a case, the widths of the first separation patterns 122*a* and 122*b* and the width of the second separation patterns 124*a* and 124*b* may decrease as they go away from the pixel isolation pattern 120.

Referring to FIG. 11, the image sensor according to some embodiments includes the first separation pattern 122 and the second separation pattern 124 spaced apart from the pixel isolation pattern 120.

For example, the first separation pattern 122 may be interposed between the first photoelectric conversion part PD1L and the second photoelectric conversion part PDIR, and may be spaced apart from the side surfaces of the pixel isolation pattern 120 extending in the first direction X. In such a case, the first connecting part IR1 that connects the first photoelectric conversion part PD1L and the second photoelectric conversion part PDIR may be defined at both ends of the first separation pattern 122.

Further, the second separation pattern 124 may be interposed between the third photoelectric conversion part PD2U and the fourth photoelectric conversion part PD2D, and may be spaced apart from the side surface of the pixel isolation pattern 120 extending in the second direction Y. In such a case, the second connecting part IR2 that connects the third photoelectric conversion part PD2U and the fourth photoelectric conversion part PD2D may be defined at both ends of the second separation pattern 124.

A width W31 of the first separation pattern 122 and a width W32 of the second separation pattern 124 may be, for example, about 10 nm to about 500 nm, respectively. In some embodiments, the width W31 of the first separation pattern 122 and the width W32 of the second separation pattern 124 may be about 100 nm to about 400 nm, respectively. Although the width W31 of the first separation pattern 122 and the width W32 of the second separation pattern 124 are only shown as being the same as each other, this is merely an example, and the widths may, of course, differ from each other.

A length L31 of the first separation pattern 122 extending in the second direction Y and a length L32 of the second separation pattern 124 extending in the first direction X may be a half or more of the size (e.g., L11 and L12 of FIG. 6) of each of the unit pixels UP1 to UP4. For example, the length L31 of the first separation pattern 122 and the length L32 of the second separation pattern 124 may be about 200 nm to about 2,000 nm, respectively. In some embodiments, the length L31 of the first separation pattern 122 and the length L32 of the second separation pattern 124 may be about 400 nm to about 1,000 nm, respectively. Although the length L31 of the first separation pattern 122 and the length L32 of the second separation pattern 124 are only shown as being the same as each other, this is merely an example, and the lengths may, of course, differ from each other.

Referring to FIG. 12, the image sensor according to some embodiments includes first separation pattern 122 and second separation pattern 124 protruding from one side surface of the pixel isolation pattern 120.

For example, the first separation pattern 122 may be interposed between the first photoelectric conversion part PD1L and the second photoelectric conversion part PDIR, and may protrude from one side surface of the pixel isolation pattern 120 extending in the first direction X. In such a case, the first connecting part IR1 that connects the first photoelectric conversion part PD1L and the second photoelectric conversion part PDIR may be defined at one end of the first separation pattern 122.

Further, the second separation pattern 124 may be interposed between the third photoelectric conversion part PD2U and the fourth photoelectric conversion part PD2D, and may protrude from one side surface of the pixel isolation pattern 120 extending in the second direction Y. In such a case, the second connecting part IR2 that connects the third photoelectric conversion part PD2U and the fourth photoelectric conversion part PD2D may be defined at one end of the second separation pattern 124.

A width W41 of the first separation pattern 122 and a width W42 of the second separation pattern 124 may be, for example, about 10 nm to about 500 nm, respectively. In some embodiments, the width W41 of the first separation pattern 122 and the width W42 of the second separation pattern 124 may be about 100 nm to about 400 nm, respectively. Although the width W41 of the first separation pattern 122 and the width W42 of the second separation pattern 124 are only shown as being the same as each other, this is merely an example, and the widths may, of course, differ from each other.

A length L41 of the first separation pattern 122 protruding in the second direction Y and a length L42 of the second separation pattern 124 protruding in the first direction X may be a half or more of the size (e.g., L11 and L12 of FIG. 6) of each of the unit pixels UP1 to UP4. For example, the length L41 of the first separation pattern 122 and the length L42 of the second separation pattern 124 may be about 200 nm to about 2,000 nm, respectively. In some embodiments, the length L41 of the first separation pattern 122 and the length L42 of the second separation pattern 124 may be about 400 nm to about 1,000 nm, respectively. Although the length L41 of the first separation pattern 122 and the length L42 of the second separation pattern 124 are only shown as being the same as each other, this is merely an example, and the lengths may, of course, differ from each other.

Figure 13:
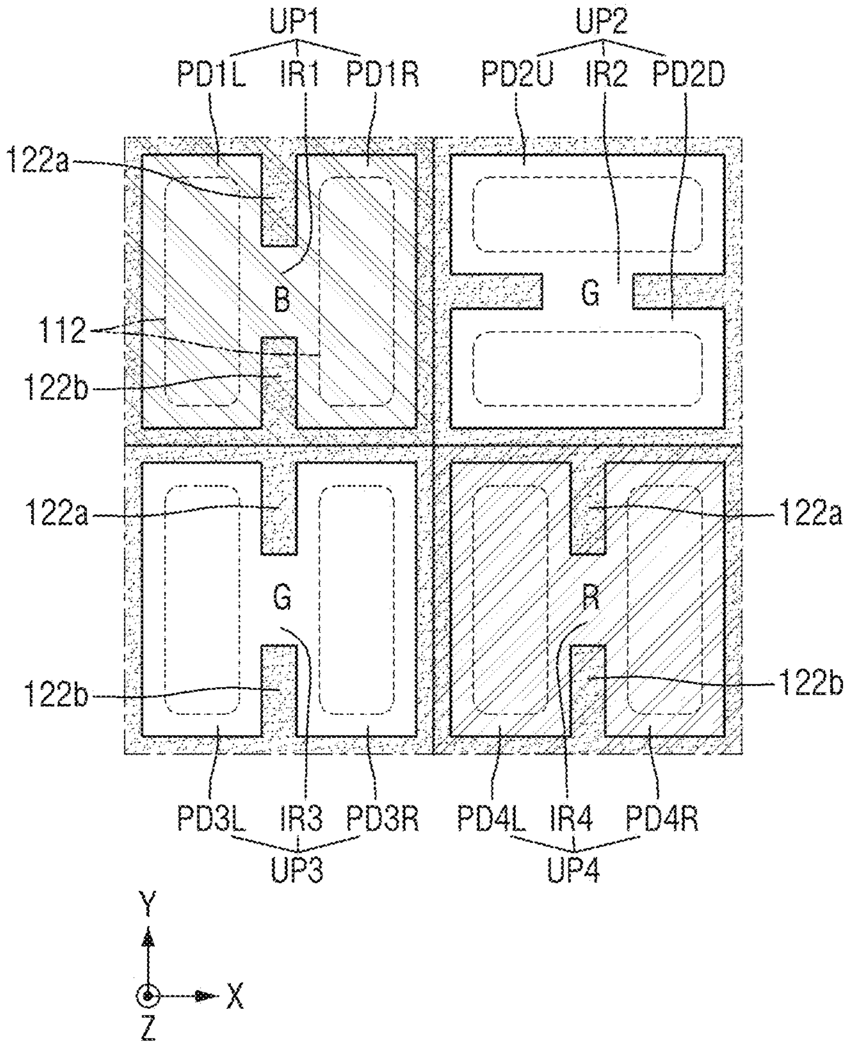
FIG. 13 is a layout diagram for explaining the unit pixels of an image sensor according to some embodiments.
Figure 14A:
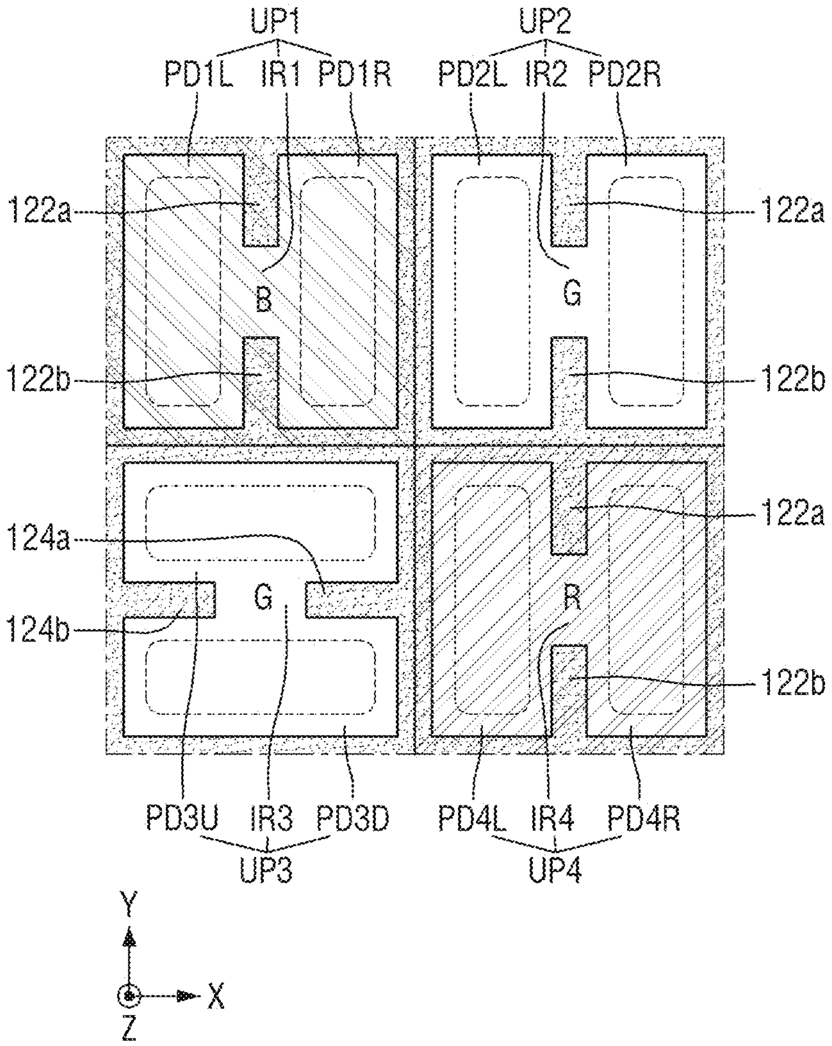
FIGS. 14A to 14F are various layout diagrams for explaining the unit pixels of the image sensor according to some embodiments.
Figure 14B:
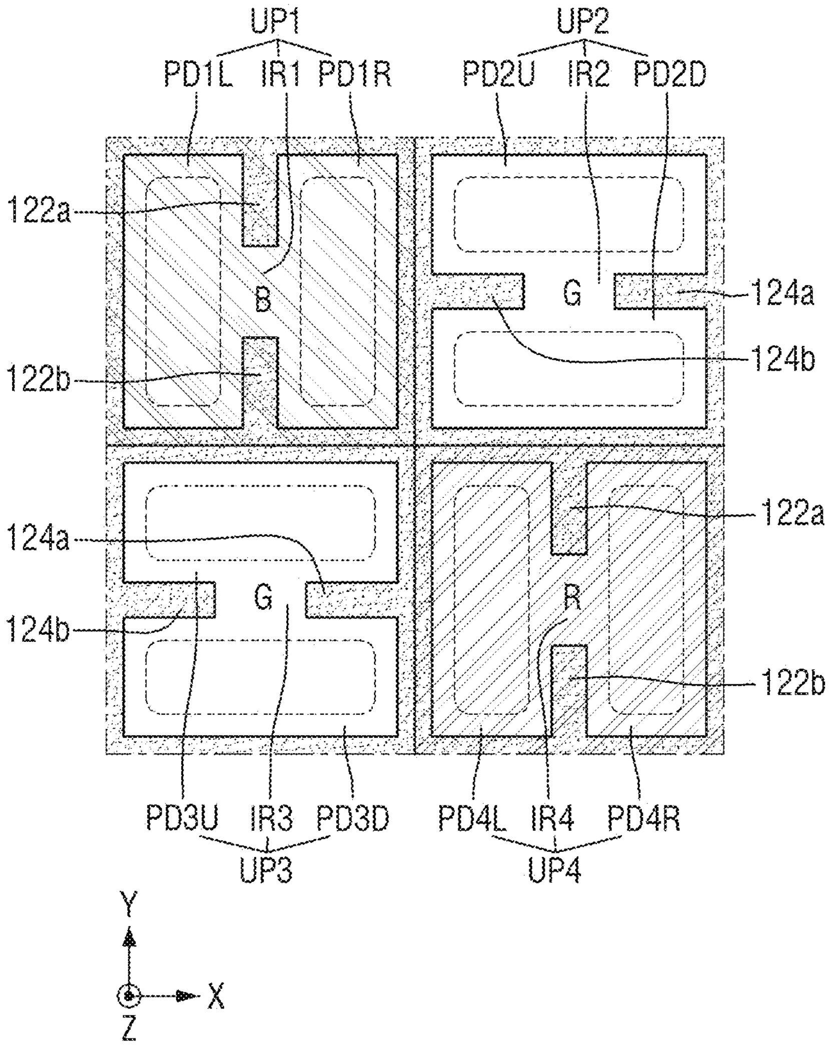
Figure 14C:
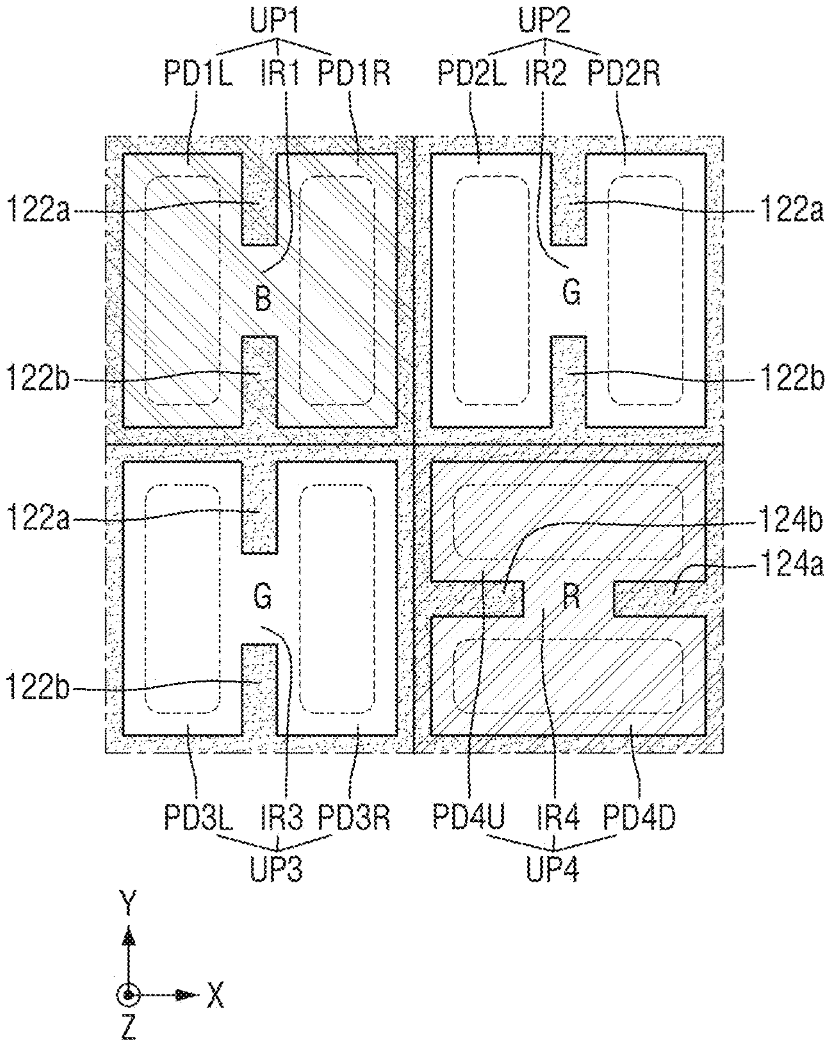
Figure 14D:
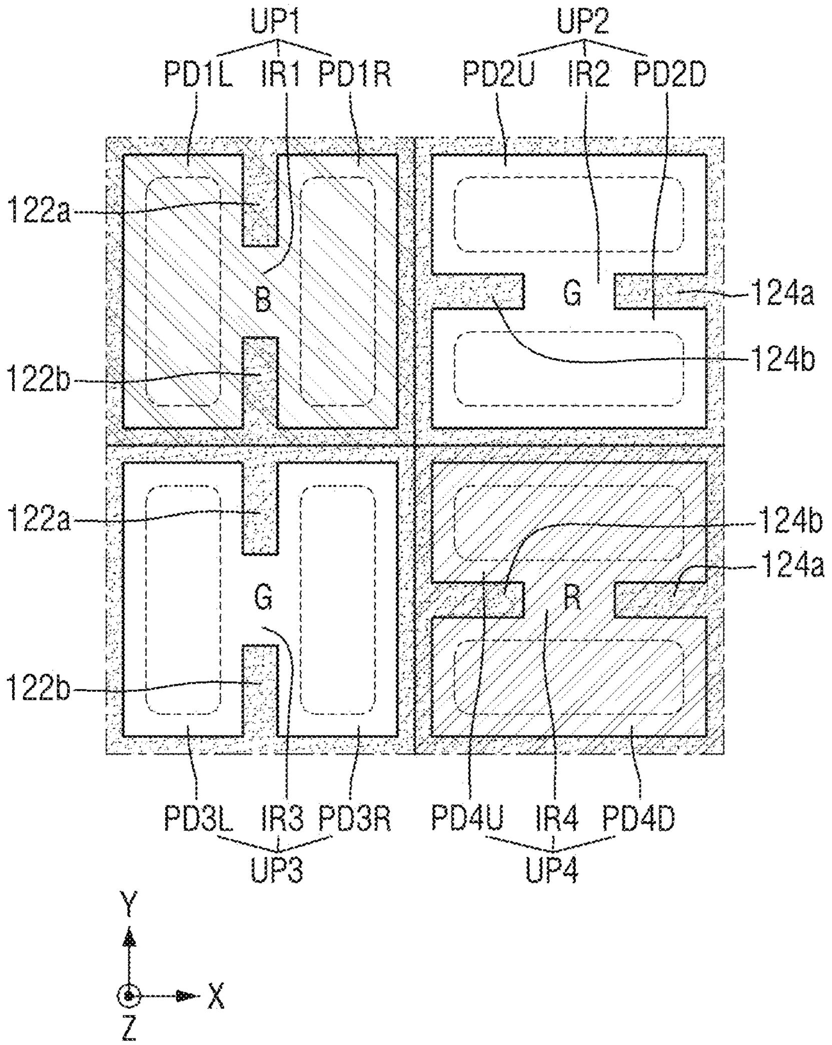
Figure 14E:
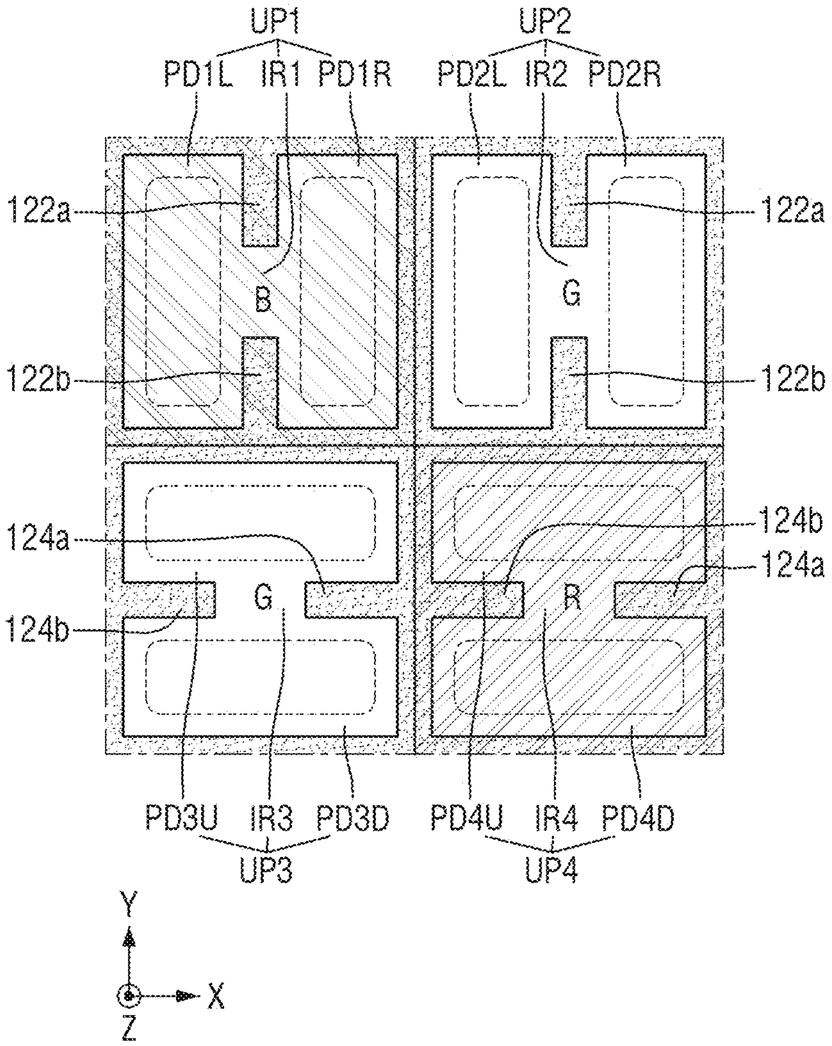
Figure 14F:
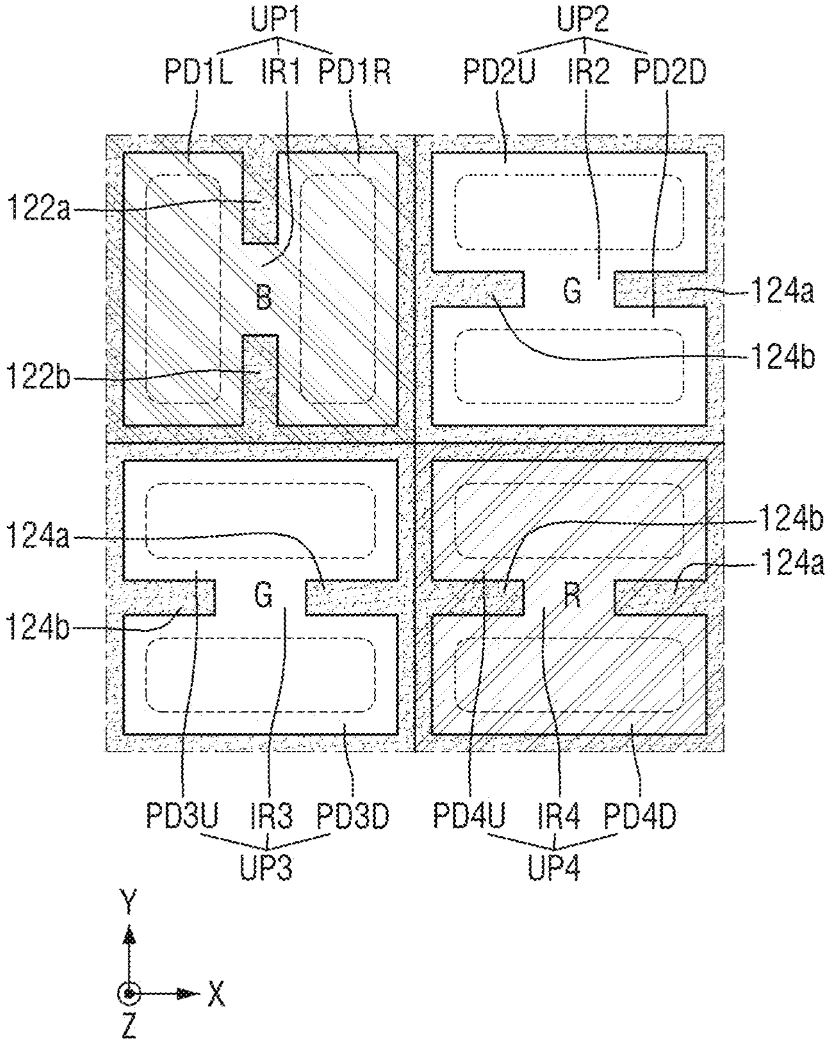

FIG. 13 is a layout diagram for explaining the unit pixels of an image sensor according to some embodiments. For convenience of explanation, repeated parts of contents explained above using FIGS. 1 to 12 will be briefly explained or omitted.

Referring to FIG. 13, in the image sensor according to some embodiments, the first unit pixel UP1 and the second unit pixel UP2 detect light of different colors (that is, light of different wavelength bands).

For example, the first color filter (170*a* of FIGS. 4 and 5) and the second color filter (170*b* of FIGS. 4 and 5) may include color filters of different colors. As an example, the first color filter 170*a* may be a blue color filter and the second color filter 170*b* may be a green color filter. In such a case, the first unit pixel UP1 may detect light B of the blue wavelength band, and the second unit pixel UP2 may detect light G of the green wavelength band.

In some embodiments, the first to fourth unit pixels UP1 to UP4 adjacent to each other may be arranged in the form of a Bayer pattern. For example, the first unit pixel UP1 may detect light B of the blue wavelength band, the second and third unit pixels UP2 and UP3 may detect light G of the green wavelength band, and the fourth unit pixel UP4 may detect light R of the red wavelength band.

FIGS. 14A to 14F are various layout diagrams for explaining the unit pixels of the image sensor according to some embodiments. FIGS. 14A to 14F show various image sensors which include unit pixels divided in different directions. The image sensor according to FIGS. 14A to 14F is the same as the image sensor according to FIGS. 9A to 9F, except for the explanation of FIG. 13, and therefore detailed explanation thereof will not be provided below.

FIGS. 15 to 20 are various layout diagrams for explaining the unit pixels of the image sensor according to some embodiments. For convenience of explanation, repeated parts of contents explained above using FIGS. 1 to 14F will be briefly explained or omitted.

Referring to FIGS. 15 to 20, the image sensor according to some embodiments includes a plurality of pixel groups PG1 to PG4.

Each of the pixel groups PG1 to PG4 may include a plurality of unit pixels adjacent to each other. Further, the pixel groups PG1 to PG4 may be arranged two-dimensionally (for example, in the form of a matrix) in a plane including the first direction X and the second direction Y that intersect the third direction Z.

The pixel groups PG1 to PG4 may include first to fourth pixel groups PG1 to PG4 adjacent to each other. As an example, the first pixel group PG1 and the second pixel group PG2 may be arranged along the first direction X. The first pixel group PG1 and the third pixel group PG3 may be arranged along the second direction Y. The fourth pixel group PG4 may be arranged along the second direction Y together with the second pixel group PG2, and may be arranged along the first direction X together with the third pixel group PG3. That is, the first pixel group PG1 and the fourth pixel group PG4 may be arranged along the diagonal direction.

In some embodiments, the first to fourth pixel groups PG1 to PG4 adjacent to each other may be arranged in the form of a Bayer pattern. For example, the first pixel group PG1 may detect light B of the blue wavelength band, the second and third pixel groups PG2 and PG3 may detect light G of the green wavelength band, and the fourth pixel group PG4 may detect light R of the red wavelength band.

Figure 15:
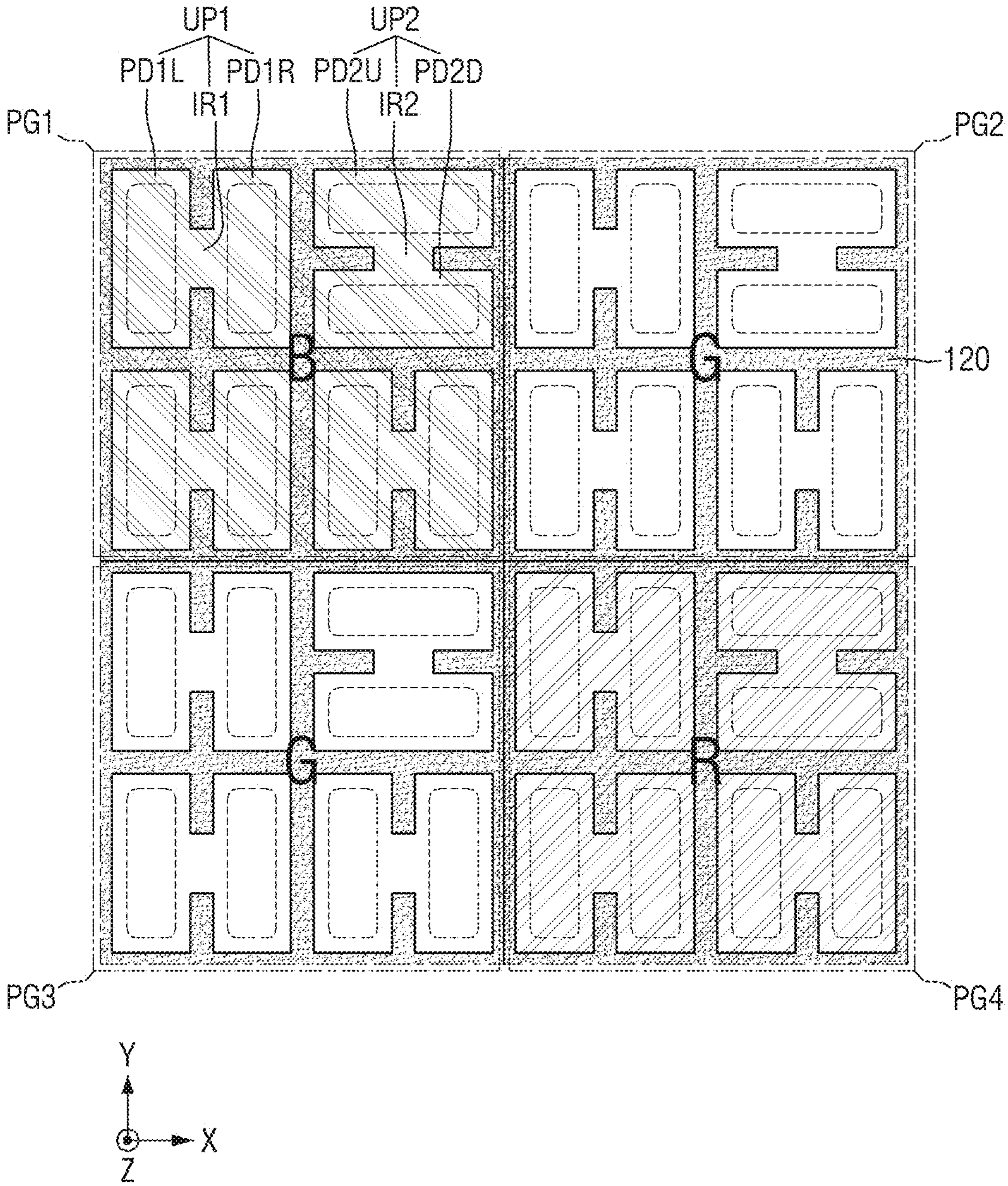
FIGS. 15 to 20 are various layout diagrams for explaining the unit pixels of the image sensor according to some embodiments.
Figure 16:
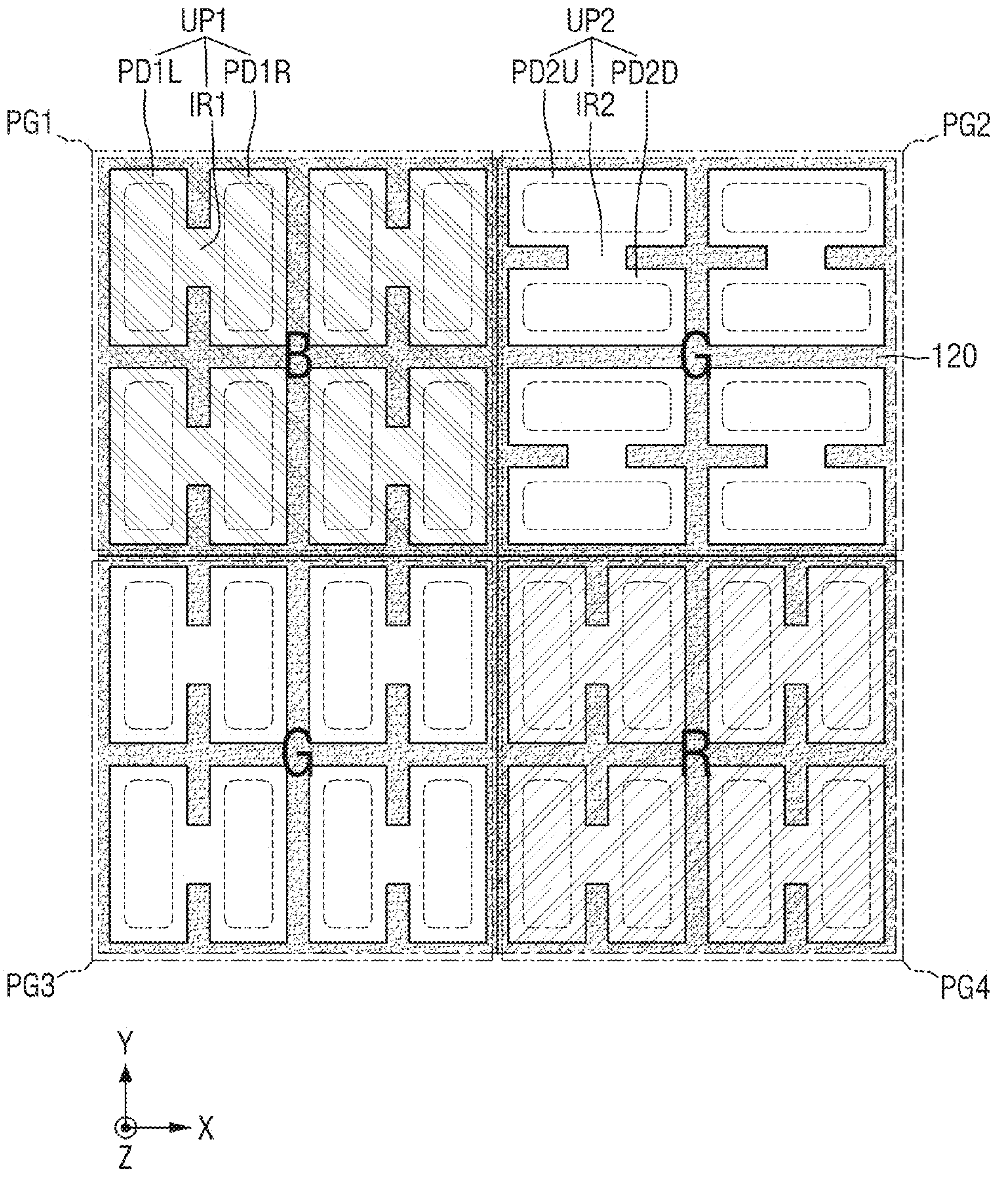

Referring to FIGS. 15 and 16, a plurality of unit pixels of each of the pixel groups PG1 to PG4 may be arranged in the form of a tetra pattern. For example, the unit pixels of the first pixel group PG1 may be arranged in the form of 2×2. Further, the unit pixels of the first pixel group PG1 may detect light of the same color as each other (for example, light B of the blue wavelength band).

Figure 17:
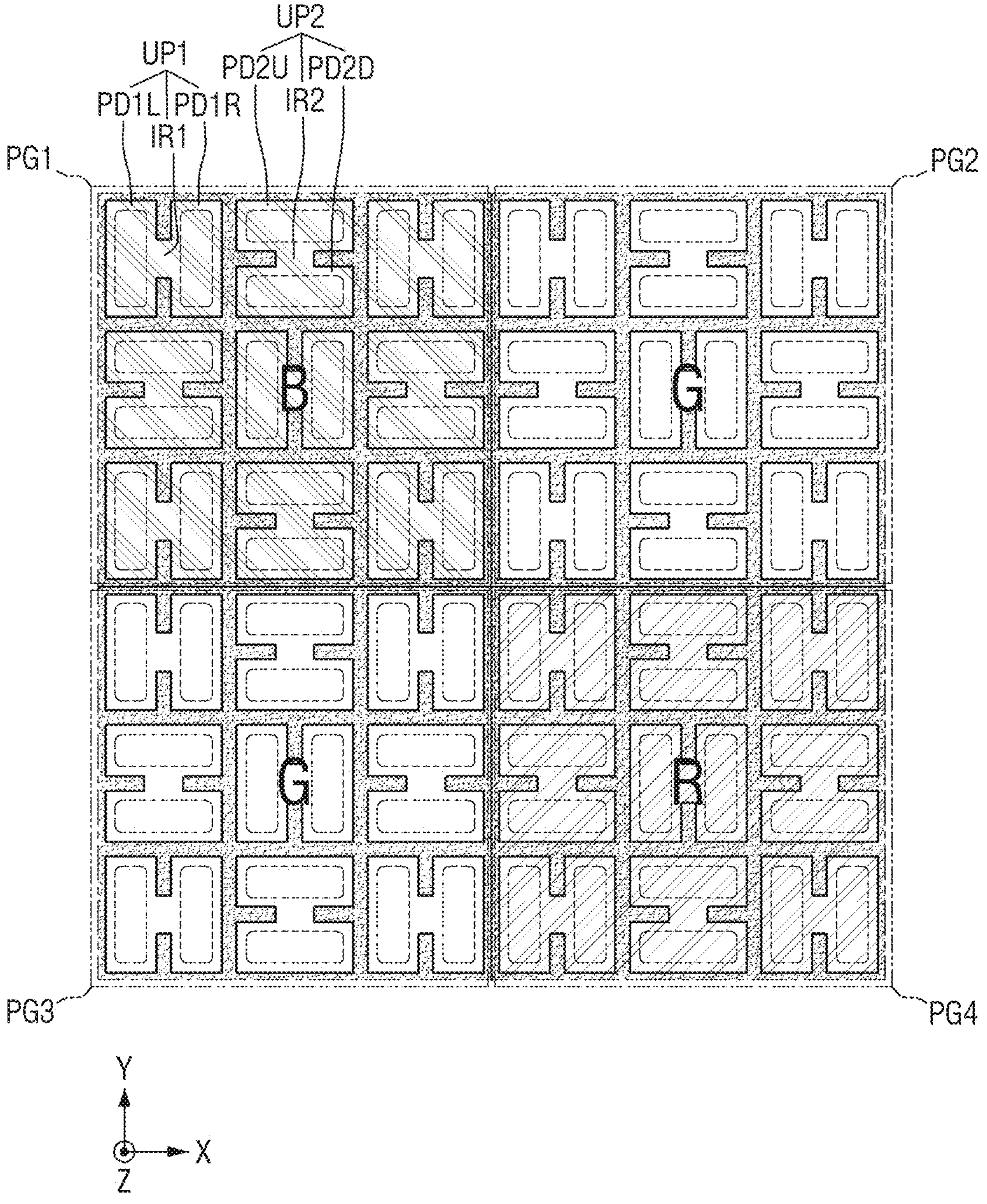
Figure 18:
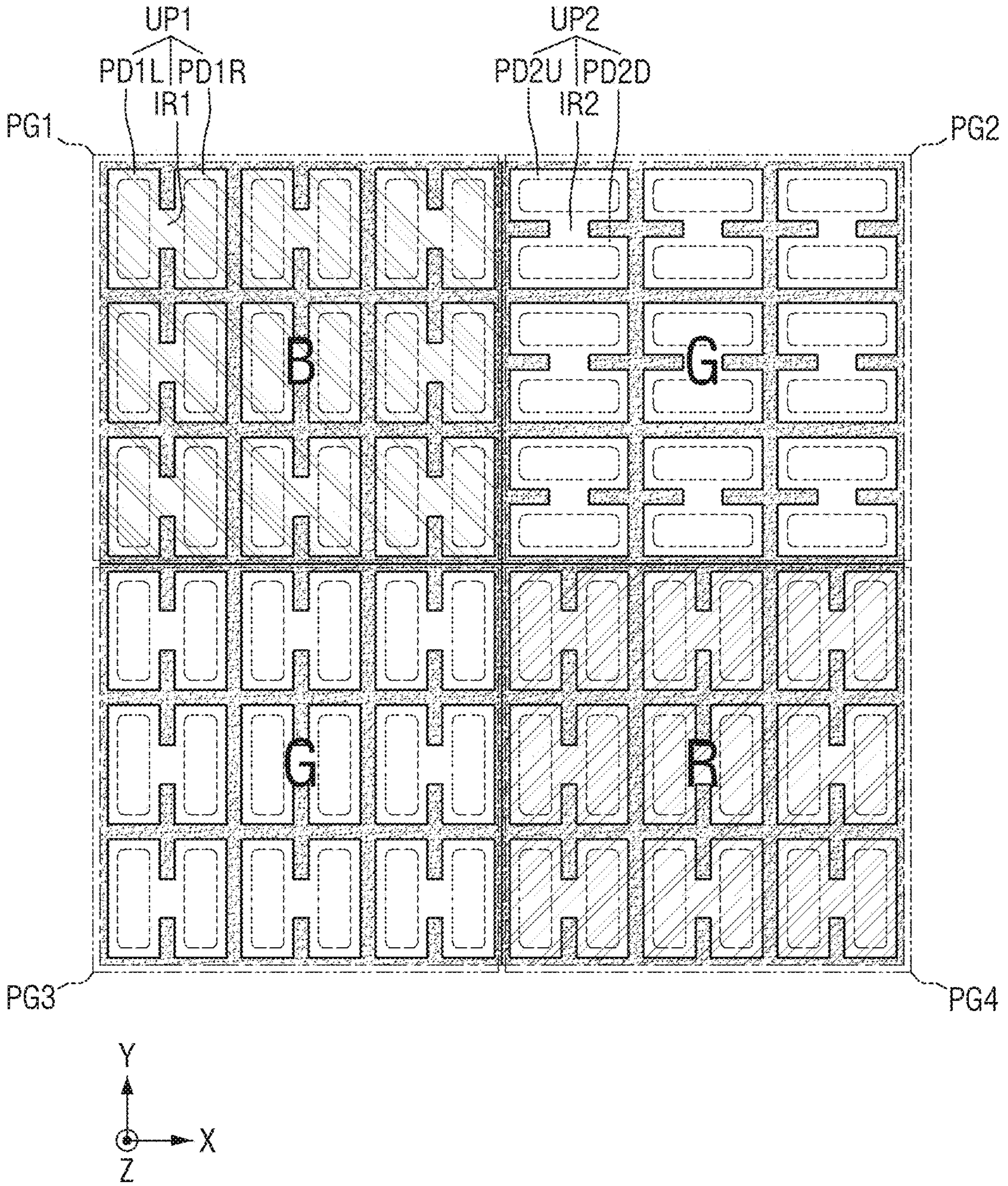

Referring to FIGS. 17 and 18, a plurality of unit pixels of each of the pixel groups PG1 to PG4 may be arranged in the form of a nona pattern. For example, the unit pixels of the first pixel group PG1 may be arranged in the form of 3×3. Further, the unit pixels of the first pixel group PG1 may detect light of the same color as each other (for example, light B of the blue wavelength band).

Figure 19:
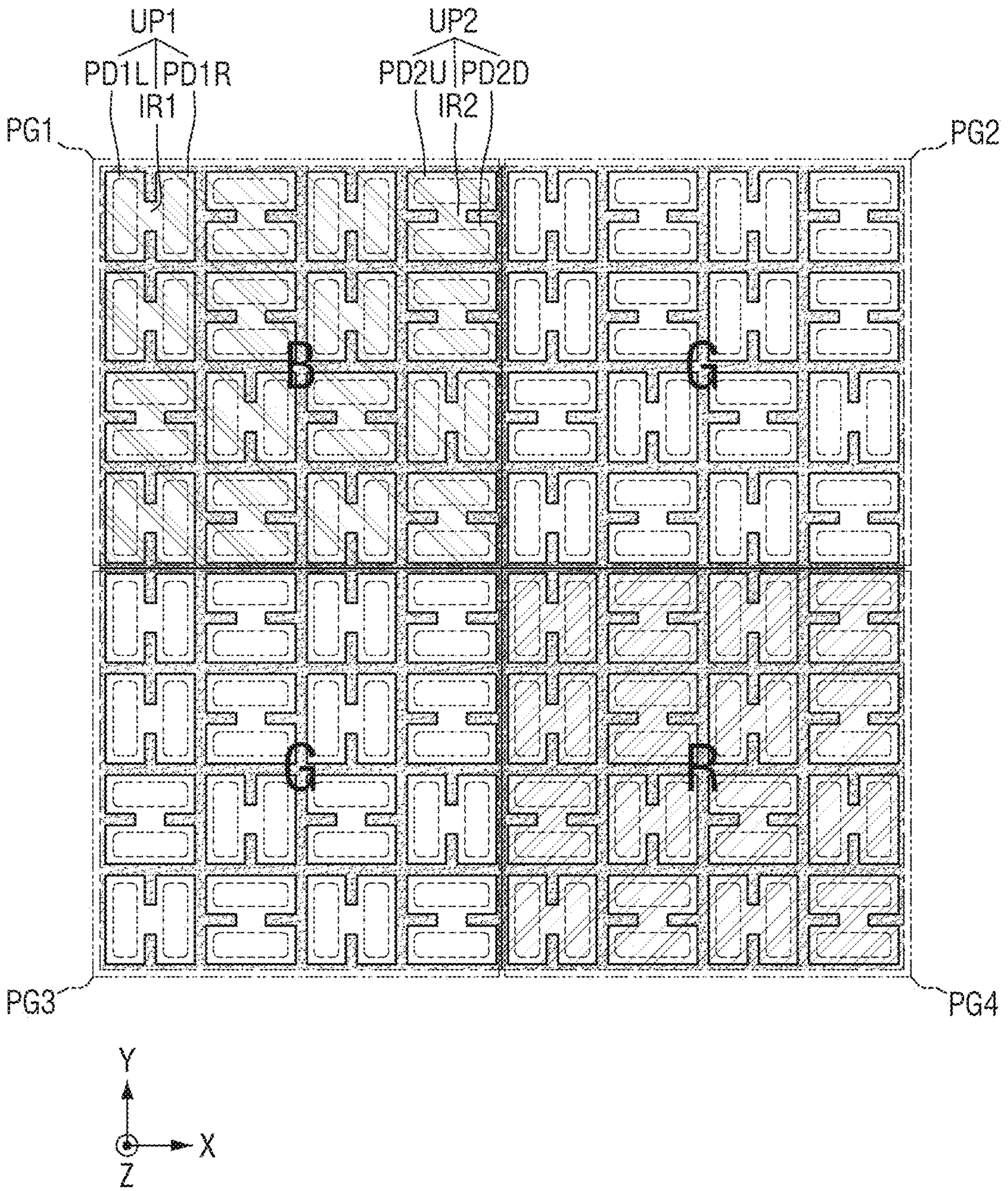
Figure 20:
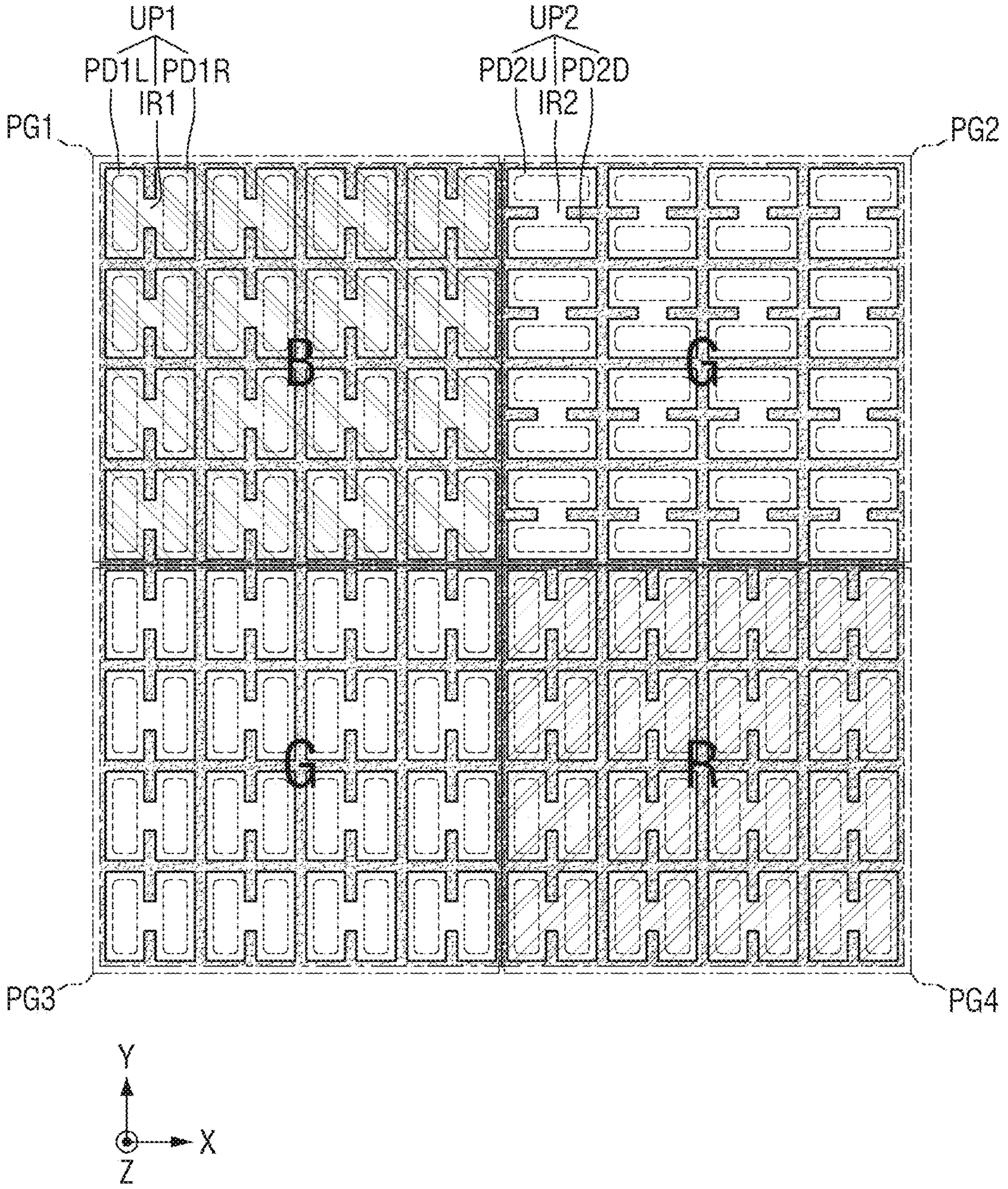

Referring to FIGS. 19 and 20, a plurality of unit pixels of each of the pixel groups PG1 to PG4 may be arranged in the form of a hexadeca pattern. For example, the unit pixels of the first pixel group PG1 may be arranged in the form of 4×4. Further, the unit pixels of the first pixel group PG1 may detect light of the same color as each other (for example, light B of the blue wavelength band).

Referring to FIGS. 15, 17 and 19 again, each of the pixel groups PG1 to PG4 may include unit pixels divided in different directions. As an example, each of the pixel groups PG1 to PG4 may include a first unit pixel UP1 divided in the first direction X, and a second unit pixel UP2 divided in the second direction Y.

Referring to FIGS. 16, 18 and 20 again, at least a part (e.g., the second pixel group PG2) of the pixel group may include unit pixels divided in different directions from the other pixel groups (e.g., the first, third and fourth pixel groups PG1, PG3 and PG4). As an example, the first pixel group PG1 may each include a plurality of first unit pixels UP1 divided in the first direction X, and the second pixel group PG2 may each include a plurality of second unit pixels UP2 divided in the second direction Y.

Figure 21:
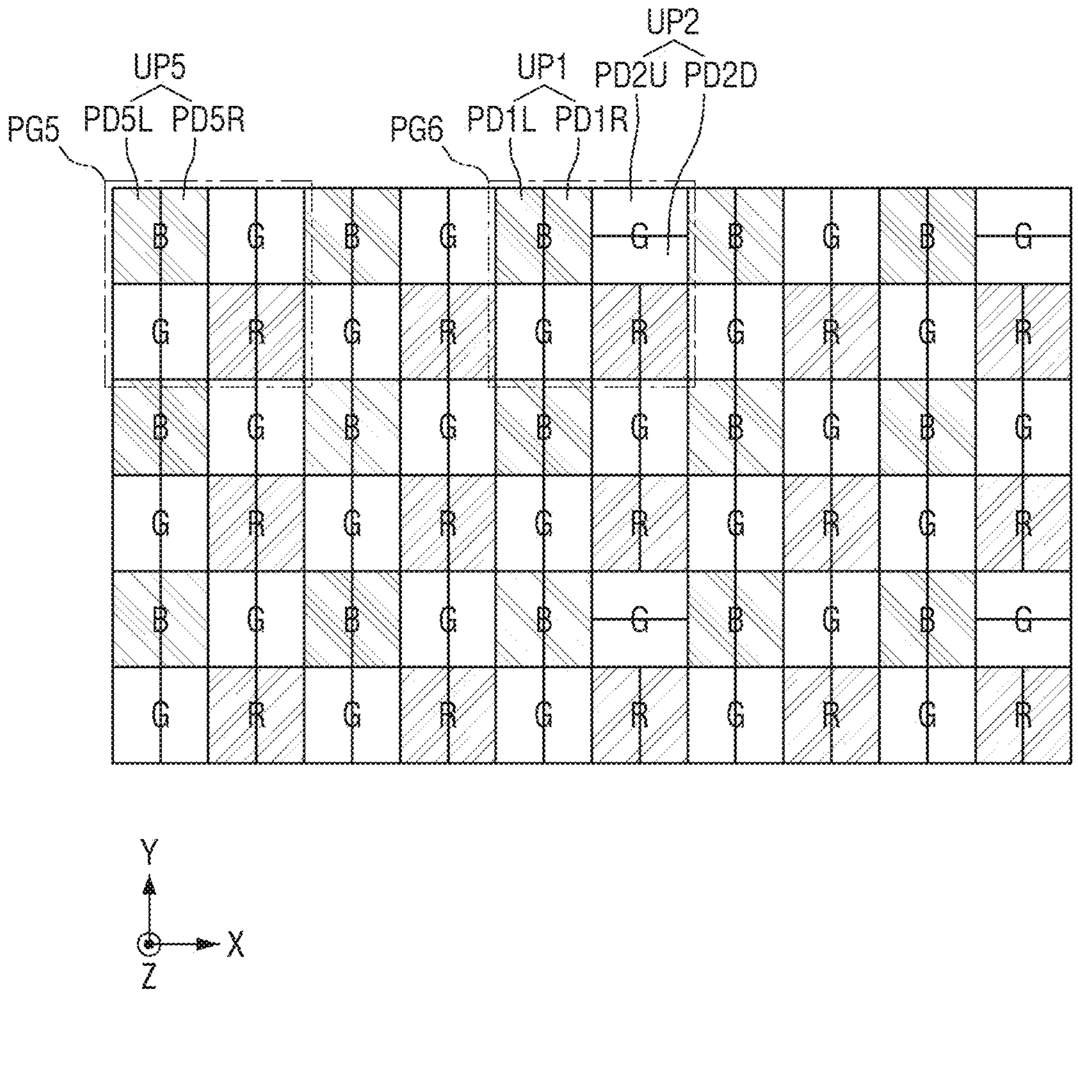
FIGS. 21 to 23 are various layout diagrams for explaining the unit pixels of the image sensor according to some embodiments.
Figure 22:
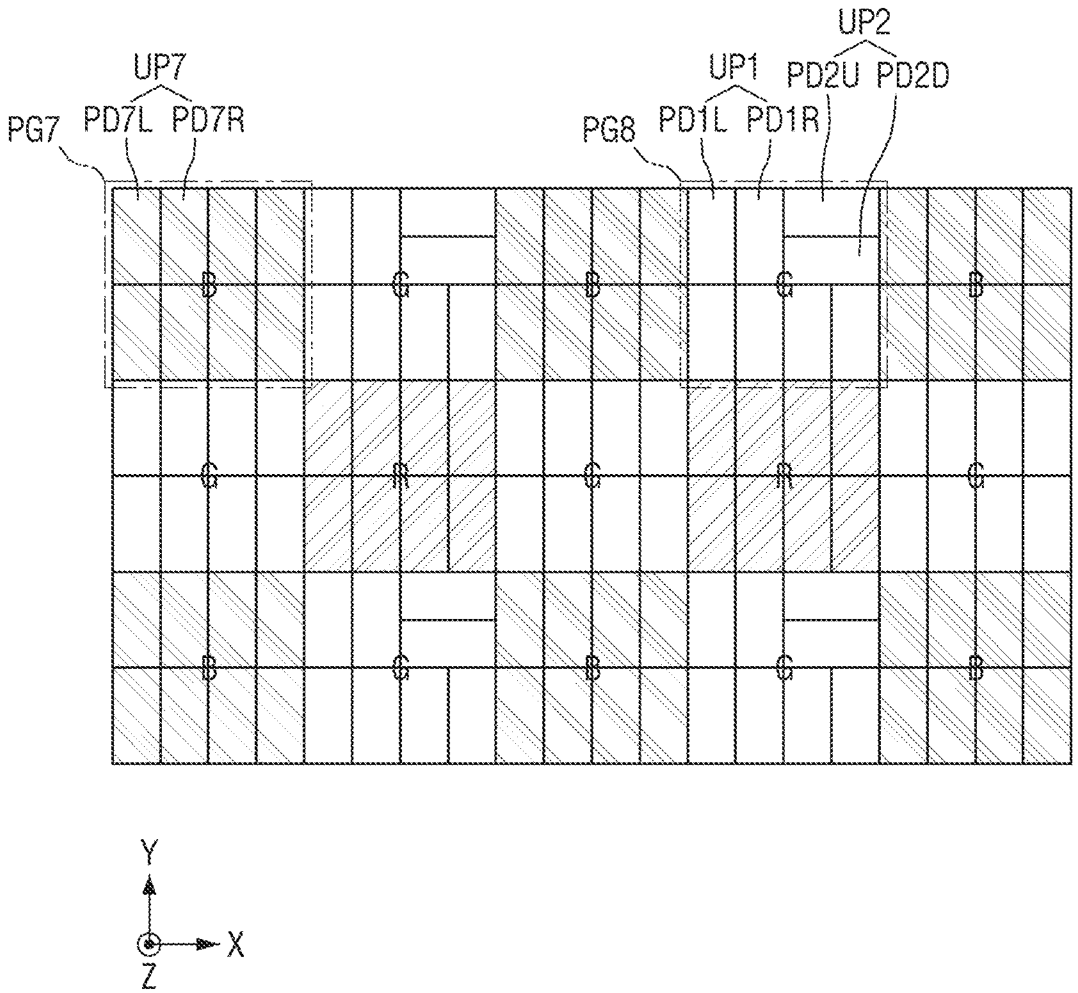
Figure 23:
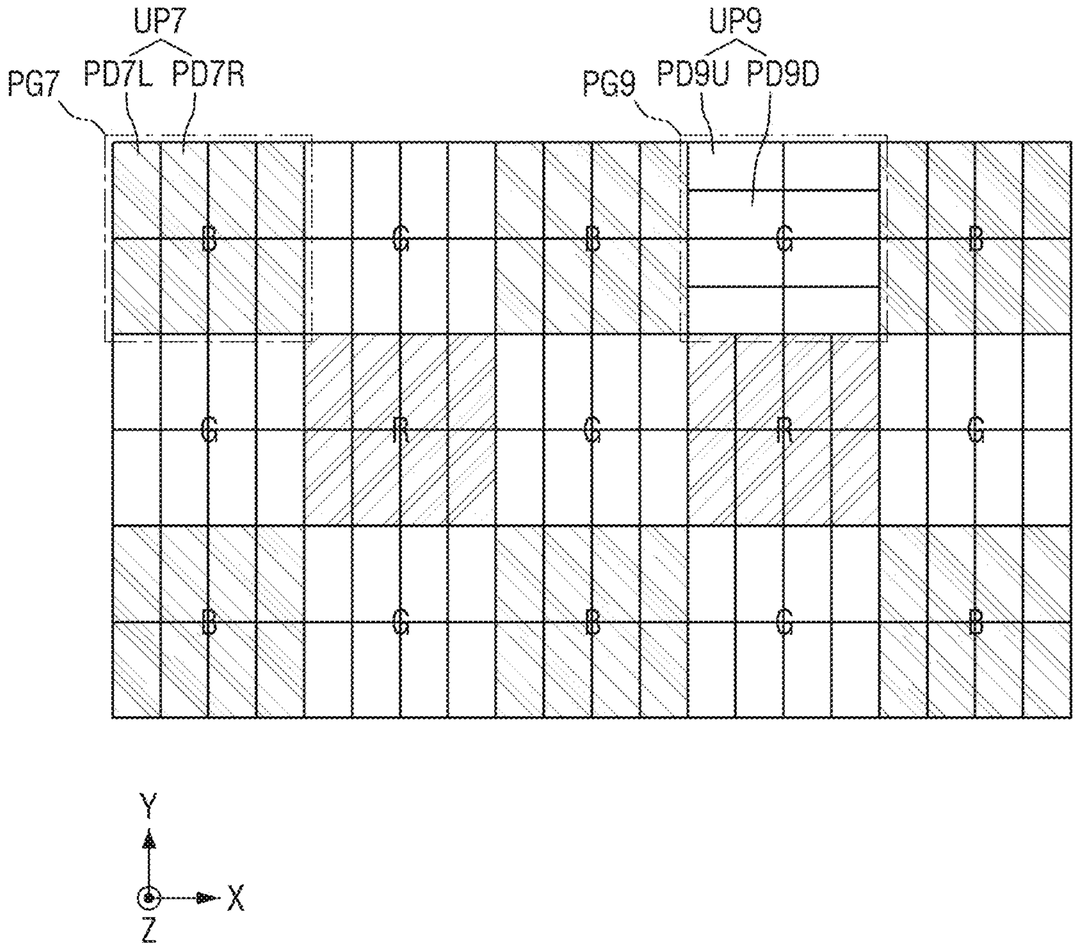

FIGS. 21 to 23 are various layout diagrams for explaining the unit pixels of the image sensor according to some embodiments. For convenience of explanation, repeated parts of contents explained above using FIGS. 1 to 20 will be briefly described or omitted.

Referring to FIG. 21, an image sensor according to some embodiments includes a fifth pixel group PG5 and a sixth pixel group PG6.

The fifth pixel group PG5 may include a plurality of fifth unit pixels UP5 adjacent to each other. The plurality of fifth unit pixels UP5 may be divided in the same direction as each other. For example, each fifth unit pixel UP5 may include a ninth photoelectric conversion part PD5L and a tenth photoelectric conversion part PD5R arranged along the first direction X.

The sixth pixel group PG6 may include unit pixels divided in different directions. As an example, the sixth pixel group PG6 may include first unit pixels UP1 divided in the first direction X and second unit pixels UP2 divided in the second direction Y.

In some embodiments, the unit pixels of the fifth pixel group PG5 and the sixth pixel group PG6 may be arranged in the form of a Bayer pattern.

Referring to FIG. 22, an image sensor according to some embodiments includes a seventh pixel group PG7 and an eighth pixel group PG8.

The seventh pixel group PG7 may include a plurality of seventh unit pixels UP7 adjacent to each other. The plurality of seventh unit pixels UP7 may be divided in the same direction as each other. For example, each seventh unit pixel UP7 may include an eleventh photoelectric conversion part PD7L and a twelfth photoelectric conversion part PD7R arranged along the first direction X.

The eighth pixel group PG8 may include unit pixels divided in different directions. As an example, the eighth pixel group PG8 may include first unit pixels UP1 divided in the first direction X and second unit pixels UP2 divided in the second direction Y.

In some embodiments, the unit pixels of the seventh pixel group PG7 and the eighth pixel group PG8 may be arranged in the form of a tetra pattern.

In some embodiments, the seventh pixel group PG7 and the eighth pixel group PG8 may detect light of different colors (e.g., light of different wavelength bands). As an example, the seventh pixel group PG7 may detect light B of the blue wavelength band, and the eighth pixel group PG8 may detect light G of the green wavelength band.

Referring to FIG. 23, an image sensor according to some embodiments includes a seventh pixel group PG7 and a ninth pixel group PG9.

Since the seventh pixel group PG7 is the same as that described above using FIG. 22, detailed description thereof will not be provided below.

The ninth pixel group PG9 may include a plurality of ninth unit pixels UP9 adjacent to each other. The plurality of ninth unit pixels UP9 may be divided in the same direction as each other. The ninth unit pixels UP9 of the ninth pixel group PG9 may be divided in a direction different from the seventh unit pixels UP7 of the seventh pixel group PG7. For example, each ninth unit pixel UP9 may include a thirteenth photoelectric conversion part PD9U and a fourteenth photoelectric conversion part PD9D arranged along the second direction Y.

In some embodiments, the unit pixels of the seventh pixel group PG7 and the ninth pixel group PG9 may be arranged in the form of a tetra pattern.

In some embodiments, the seventh pixel group PG7 and the ninth pixel group PG9 may detect light of different colors (e.g., light of different wavelength bands). As an example, the seventh pixel group PG7 may detect light B of the blue wavelength band, and the ninth pixel group PG9 may detect light G of the green wavelength band.

Figure 24:
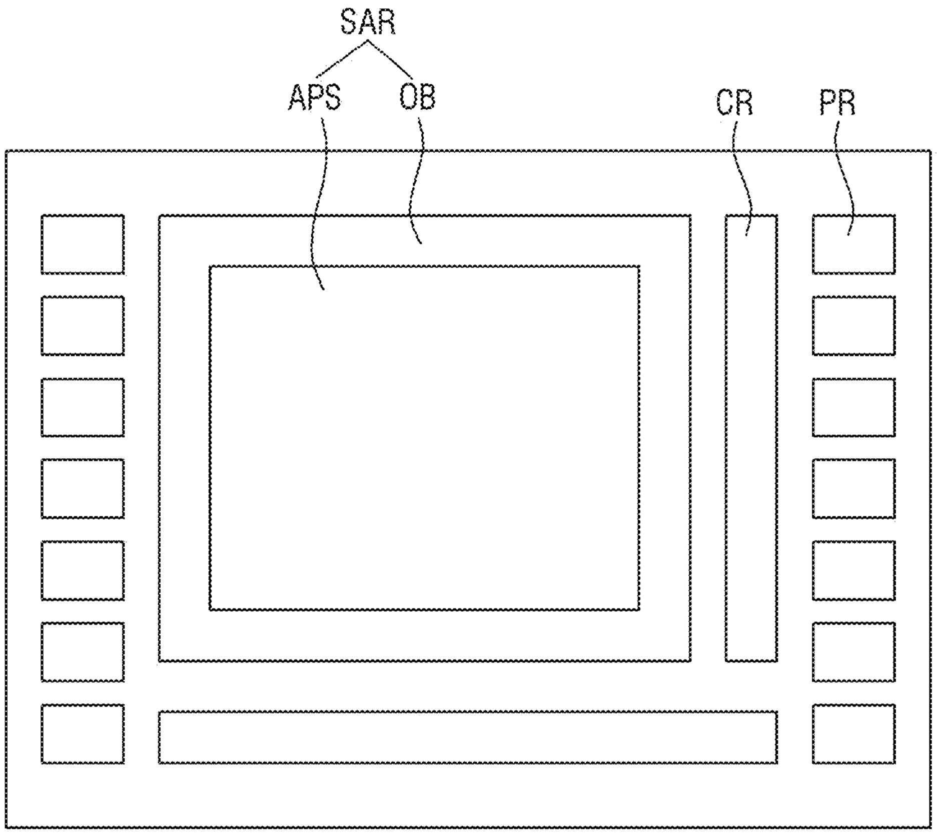
FIG. 24 is a schematic layout diagram for explaining an image sensor according to some embodiments.
Figure 25:
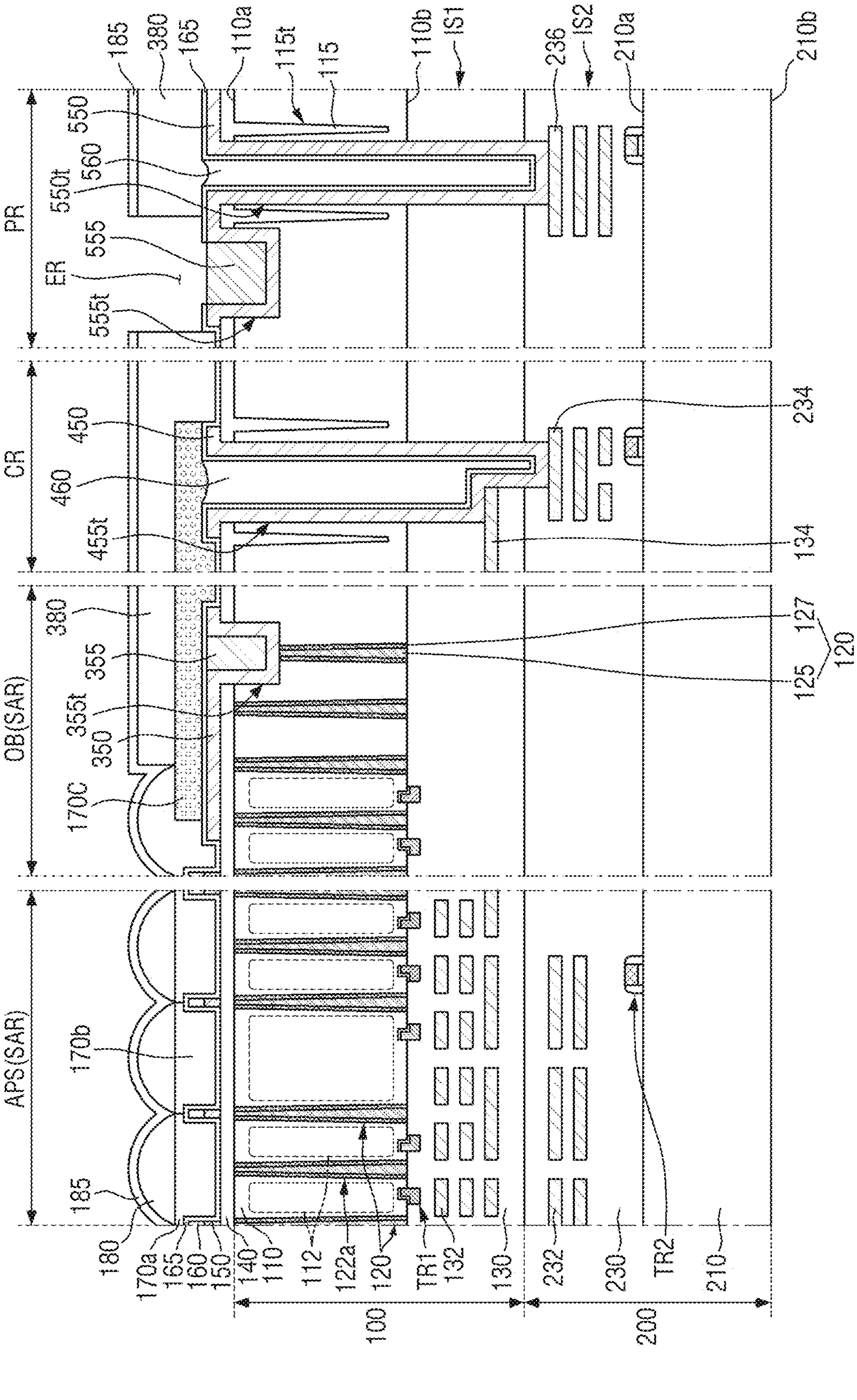
FIG. 25 is a schematic cross-sectional view for explaining an image sensor according to some embodiments.

FIG. 24 is a schematic layout diagram for explaining an image sensor according to some embodiments. FIG. 25 is a schematic cross-sectional view for explaining an image sensor according to some embodiments. For convenience of explanation, repeated parts of contents explained above using FIGS. 1 to 23 will be briefly described or omitted.

Referring to FIGS. 24 and 25, the image sensor according to some embodiments includes a sensor array region SAR, a connecting region CR, and a pad region PR.

The sensor array region SAR may include a region corresponding to the active pixel sensor array 10 of FIG. 1. For example, a plurality of unit pixels (e.g., UP1 to UP4 of FIG. 3) arranged two-dimensionally (e.g., in the form of a matrix) may be formed in the sensor array region SAR.

The sensor array region SAR may include a light-receiving region APS and a light-shielding region OB. Active pixels that receive light and generate an active signal may be arranged inside the light-receiving region APS. Optical black pixels that shield light to generate an optical black signal may be arranged in the light-shielding region OB. Although the light-shielding region OB may be formed, for example, along the periphery of the light-receiving region APS, this is merely an example.

In some embodiments, the photoelectric conversion region 112 may not be formed in a part of the light-shielding region OB. For example, the photoelectric conversion region 112 may be formed inside the first substrate 110 of the light-shielding region OB adjacent to the light-receiving region APS, but may not be formed inside the first substrate 110 of the light-shielding region OB spaced apart from the light-receiving region APS.

In some embodiments, dummy pixels (not shown) may be formed in the light-receiving region APS adjacent to the light-shielding region OB.

The connecting region CR may be formed around the sensor array region SAR.

Although the connecting region CR may be formed on one side of the sensor array region SAR, this is merely an example. Wirings are formed in the connecting region CR, and may be configured to transmit and receive electrical signals of the sensor array region SAR.

A pad region PR may be formed around the sensor array region SAR. Although the pad region PR may be formed to be adjacent to the edge of the image sensor according to some embodiments, this is merely an example. The pad region PR is connected to an external device or the like, and may be configured to transmit and receive electrical signals between the image sensor according to some embodiments and the external device.

Although the connecting region CR is shown as being interposed between the sensor array region SAR and the pad region PR, this is merely an example. The placement of the sensor array region SAR, the connecting region CR and the pad region PR may, of course, be various as needed.

In the image sensor according to some embodiments, the first substrate 110 and the first wiring structure IS1 may form the first substrate structure 100.

The first wiring structure IS1 may include a first wiring 132 in the sensor array region SAR, and a second wiring 134 in the connecting region CR. The first wiring 132 may be electrically connected to unit pixels (e.g., UP1 to UP4 of FIG. 3) of the sensor array region SAR. For example, the first wiring 132 may be connected to the first electronic element TR1. At least a part of the second wiring 134 may extend from the sensor array region SAR. For example, at least a part of the second wiring 134 may be electrically connected to at least a part of the first wiring 132. Accordingly, the second wiring 134 may be electrically connected to the unit pixels (e.g., UP1 to UP4 of FIG. 3) of the sensor array region SAR.

The image sensor according to some embodiments may include a second substrate 210 and a second wiring structure IS2.

The second substrate 210 may be bulk silicon or SOI (silicon-on-insulator). The second substrate 210 may be a silicon substrate, or may include other materials, for example, silicon germanium, indium antimonide, lead tellurium compounds, indium arsenic, indium phosphide, gallium arsenide or gallium antimonide. Alternatively, the second substrate 210 may have an epitaxial layer formed on a base substrate.

The second substrate 210 may include a third surface 210*a* and a fourth surface 210*b* that are opposite to each other. The third surface 210*a* of the second substrate 210 may be a surface that is opposite to the second surface 110*b* of the first substrate 110.

A second electronic element TR2 may be formed on the third surface 210*a* of the second substrate 210. The second electronic element TR2 is electrically connected to the sensor array region SAR and may transmit and receive electrical signals to and from each unit pixel (e.g., UP1 to UP4 of FIG. 3) of the sensor array region SAR. For example, the second electronic element TR2 may include the electronic elements that constitute the row decoder 20, the row driver 30, the column decoder 40, the timing generator 50, the correlated double sampler 60, the analog-to-digital converter 70 or the I/O buffer 80 of FIG. 1.

The second wiring structure IS2 may be formed on the third surface 210*a* of the second substrate 210. The second substrate 210 and the second wiring structure IS2 may form the second substrate structure 200.

The second wiring structure IS2 may be attached to the first wiring structure IS1. For example, as shown in FIG. 25, the upper surface of the second wiring structure IS2 may be attached to the lower surface of the first wiring structure IS1.

The second wiring structure IS2 may be made up of one or multiple wirings. For example, the second wiring structure IS2 may include a second inter-wiring insulating film 230, and a plurality of wirings 232, 234, and 236 inside the second inter-wiring insulating film 230. In FIG. 25, the number of layers of wirings that constitute the second wiring structure IS2, the placement thereof and the like are merely examples, but are not limited thereto.

At least a part of the wirings 232, 234, and 236 of the second wiring structure IS2 may be connected to the second electronic element TR2. In some embodiments, the second wiring structure IS2 may include a third wiring 232 in the sensor array region SAR, a fourth wiring 234 in the connecting region CR, and a fifth wiring 236 in the pad region PR. In some embodiments, the fourth wiring 234 may be an uppermost wiring of the plurality of wirings in the connecting region CR, and the fifth wiring 236 may be an uppermost wiring of the plurality of wirings in the pad region PR.

The image sensor according to some embodiments may include a first connecting structure 350, a second connecting structure 450, and a third connecting structure 550.

The first connecting structure 350 may be formed inside the light-shielding region OB. The first connecting structure 350 may be formed on the surface insulating film 140 of the light-shielding region OB. The first connecting structure 350 may be in contact with the pixel isolation pattern 120. For example, a first trench 355*t* that exposes the pixel isolation pattern 120 may be formed inside the first substrate 110 and the surface insulating film 140 of the light-shielding region OB. The first connecting structure 350 is formed inside the first trench 355*t*, and may be in contact with the pixel isolation pattern 120 in the light-shielding region OB. In some embodiments, the first connecting structure 350 may extend along the profiles of the side surfaces and the lower surface of the first trench 355*t*.

The first connecting structure 350 may include, but is not limited to, for example, at least one of titanium (Ti), titanium nitride (TiN), tantalum (Ta), tantalum nitride (TaN), tungsten (W), aluminum (Al), copper (Cu) and combinations thereof.

In some embodiments, the first connecting structure 350 may be electrically connected to the pixel isolation pattern 120 to apply a ground voltage or a negative voltage to the pixel isolation pattern 120. Accordingly, the electric charges generated by ESD or the like may be discharged to the first connecting structure 350 through the pixel isolation pattern 120. An ESD bruise defect may be effectively limited and/or prevented accordingly.

In some embodiments, a first pad 355 that fills the first trench 355*t* may be formed on the first connecting structure 350. Although the first pad 355 may include, but is not limited to, for example, at least one of tungsten (W), copper (Cu), aluminum (Al), gold (Au), silver (Ag), and alloys thereof.

In some embodiments, the first protective film 165 may cover the first connecting structure 350 and the first pad 355. For example, the first protective film 165 may extend along the profiles of the first connecting structure 350 and the first pad 355.

The second connecting structure 450 may be formed inside the connecting region CR. The second connecting structure 450 may be formed on the surface insulating film 140 of the connecting region CR. The second connecting structure 450 may electrically connect the first substrate structure 100 and the second substrate structure 200. For example, a second trench 455*t* that exposes the second wiring 134 and the fourth wiring 234 may be formed inside the first substrate structure 100 and the second substrate structure 200 of the connecting region CR. The second connecting structure 450 is formed inside the second trench 455*t* and may connect the second wiring 134 with the fourth wiring 234. In some embodiments, the second connecting structure 450 may extend along the profiles of the side surfaces and the lower surface of the second trench 455*t*.

The second connecting structure 450 may include, but is not limited to, for example, at least one of titanium (Ti), titanium nitride (TiN), tantalum (Ta), tantalum nitride (TaN), tungsten (W), aluminum (Al), copper (Cu), and combinations thereof. In some embodiments, the second connecting structure 450 may be formed at the same level as the first connecting structure 350.

In some embodiments, the first protective film 165 may cover the second connecting structure 450. For example, the first protective film 165 may extend along the profile of the second connecting structure 450.

In some embodiments, a first filling insulating film 460 that fills the second trench 455*t* may be formed on the second connecting structure 450. The first filling insulating film 460 may include, but is not limited to, for example, at least one of silicon oxide, aluminum oxide, tantalum oxide, and a combination thereof.

A third connecting structure 550 may be formed inside the pad region PR. The third connecting structure 550 may be formed on the surface insulating film 140 of the pad region PR. The third connecting structure 550 may electrically connect the second substrate structure 200 to an external device or the like. For example, a third trench 550*t* that exposes the fifth wiring 236 may be formed inside the first substrate structure 100 and the second substrate structure 200 of the pad region PR. The third connecting structure 550 is formed in the third trench 550*t* and may be in contact with the fifth wiring 236. Further, a fourth trench 555*t* may be formed inside the first substrate 110 of the pad region PR. The third connecting structure 550 may be formed inside the fourth trench 555*t* and exposed. In some embodiments, the third connecting structure 550 may extend along the profiles of the side surfaces and the lower surfaces of the third trench 550*t* and the fourth trench 555*t*.

The third connecting structure 550 may include, but is not limited to, for example, at least one of titanium (Ti), titanium nitride (TiN), tantalum (Ta), tantalum nitride (TaN), tungsten (W), aluminum (Al), copper (Cu), and combinations thereof. In some embodiments, the third connecting structure 550 may be formed at the same level as the first connecting structure 350 and the second connecting structure 450.

In some embodiments, a second filling insulating film 560 that fills the third trench 550*t* may be formed on the third connecting structure 550. The second filling insulating film 560 may include, but is not limited to, for example, at least one of silicon oxide, aluminum oxide, tantalum oxide, and a combination thereof. In some embodiments, the second filling insulating film 560 may be formed at the same level as the first filling insulating film 460.

In some embodiments, a second pad 555 that fills the fourth trench 555*t* may be formed on the third connecting structure 550. The second pad 555 may include, but is not limited to, for example, at least one of tungsten (W), copper (Cu), aluminum (Al), gold (Au), silver (Ag), and alloys thereof. In some embodiments, the second pad 555 may be formed at the same level as the first pad 355.

In some embodiments, the first protective film 165 may cover the third connecting structure 550. For example, the first protective film 165 may extend along the profile of the third connecting structure 550. In some embodiments, the first protective film 165 may expose the second pad 555.

In some embodiments, the element separation pattern 115 may be formed inside the first substrate 110. For example, an element separation trench 115*t* may be formed inside the first substrate 110. The element separation pattern 115 may be formed inside the element separation trench 115*t*.

In FIG. 25, although the element separation pattern 115 is shown as being formed only around the second connecting structure 450 of the connecting region CR and around the third connecting structure 550 of the pad region PR, this is merely an example. For example, the element separation pattern 115 may, of course, be formed around the first connecting structure 350 of the light-shielding region OB.

The element separation pattern 115 may include, but is not limited to, for example, at least one of silicon oxide, silicon nitride, silicon oxynitride, aluminum oxide, hafnium oxide, and combinations thereof.

In some embodiments, the width of the element separation pattern 115 may decrease from the first surface 110*a* of the first substrate 110 toward the second surface 110*b* of the first substrate 110. This may be due to the fact that the etching process for forming the element separation trench 115*t* is performed on the first surface 110*a* of the first substrate 110. That is, the element separation pattern 115 may be a BDTI (backside deep trench isolation) formed by the DTI process on the back side of the first substrate 110. In some embodiments, the element separation pattern 115 may be isolated from the second surface 110*b* of the first substrate 110.

In some embodiments, a light-shielding color filter 170C may be formed on the first connecting structure 350 and the second connecting structure 450. For example, the light-shielding color filter 170C may be formed to cover a part of the first protective film 165 in the light-shielding region OB and the connecting region CR. The light-shielding color filter 170C may include, but is not limited to, for example, a blue color filter.

In some embodiments, a third protective film 380 may be formed on the light-shielding color filter 170C. For example, the third protective film 380 may be formed to cover a part of the first protective film 165 in the light-shielding region OB, the connecting region CR and the pad region PR. In some embodiments, the second protective film 185 may extend along the surface of the third protective film 380. The third protective film 380 may include, but is not limited to, for example, a light-transmitting resin. In some embodiments, the third protective film 380 may be formed at the same level as the microlens 180.

In some embodiments, the second protective film 185 and the third protective film 380 may expose the second pad 555. For example, an exposure opening ER that exposes the second pad 555 may be formed inside the second protective film 185 and the third protective film 380. Accordingly, the second pad 555 may be connected to an external device or the like, and configured to transmit and receive electrical signals between the image sensor according to some embodiments and the external device. That is, the second pad 555 may be an I/O pad of the image sensor according to some embodiments.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to example embodiments thereof, it will be understood by those of ordinary skill in the art that various changes in form and details may be made therein without departing from the spirit and scope of inventive concepts as defined by the following claims. It is therefore desired that the presented embodiments be considered in all respects as illustrative and not restrictive, reference being made to the appended claims rather than the foregoing description to indicate the scope of inventive concepts.

What is claimed is:

1. An image sensor comprising:

a substrate including a first surface on which light is incident and a second surface opposite to the first surface;

a first pixel group configured to detect light of a first color; and a second pixel group adjacent to the first pixel group and configured to detect light of a second color different from the first color, wherein the first pixel group includes first to fourth unit pixels, the second pixel group includes fifth to eighth unit pixels, the first unit pixel and the second unit pixel being adjacent along a first direction, the first unit pixel and the third unit pixel being adjacent along a second direction intersecting the first direction, the second unit pixel and the fourth unit pixel being adjacent along the second direction, and the third unit pixel and the fourth unit pixel being adjacent along the first direction, the fifth unit pixel and the sixth unit pixel being adjacent along the first direction, the fifth unit pixel and the seventh unit pixel being adjacent along the second direction, the sixth unit pixel and the eighth unit pixel being adjacent along the second direction, and the seventh unit pixel and the eighth unit pixel being adjacent along the first direction, each of the first unit pixel, the second unit pixel, the third unit pixel, and the fourth unit pixel, the fifth unit pixel, the seventh unit pixel, and the eighth unit pixel includes a first photoelectric conversion part and a second photoelectric conversion part arranged along the first direction, in the substrate, the sixth unit pixel includes a third photoelectric conversion part and a fourth photoelectric conversion part arranged along the second direction, on a level of the first surface, each of the first photoelectric conversion part and the second photoelectric conversion part has a dimension in the first direction less than a dimension thereof in the second direction, on a level of the second surface, each of the first photoelectric conversion part and the second photoelectric conversion part has a dimension in the first direction less than a dimension thereof in the second direction, on a level of the first surface, each of the third photoelectric conversion part and the fourth photoelectric conversion part has a dimension in the first direction greater than a dimension thereof in the second direction, and on a level of the second surface, each of the third photoelectric conversion part and the fourth photoelectric conversion part has a dimension in the first direction greater than a dimension thereof in the second direction.

2. The image sensor of claim 1, further comprising:

a pixel isolation pattern surrounding each of the first unit pixel and the second unit pixel;

a first separation pattern extending in the second direction, in the substrate between the first photoelectric conversion part and the second photoelectric conversion part; and a second separation pattern extending in the first direction, in the substrate between the third photoelectric conversion part and the fourth photoelectric conversion part.

3. The image sensor of claim 2, wherein a width of the pixel isolation pattern, a width of the first separation pattern, and a width of the second separation pattern each decrease from the second surface of the substrate toward the first surface of the substrate.

4. The image sensor of claim 2, wherein the pixel isolation pattern and the first separation pattern define the first unit pixel such that the first unit pixel has a "H" shape from a planar viewpoint, and the pixel isolation pattern and the second separation pattern define the second unit pixel such that the second unit pixel has an "I" shape from the planar viewpoint.

5. An image sensor comprising:

a substrate including a first surface on which light is incident and a second surface opposite to the first surface;

a first pixel group, the first pixel group including first to third unit pixels adjacent to each other and configured to detect light of a first color, the first and second unit pixels arranged along a first direction, the first and third unit pixels arranged along a second direction intersecting the first direction; and a second pixel group adjacent to the first pixel group, the second pixel group including fourth to sixth unit pixels adjacent to each other and configured to detect light of a second color different from the first color, the fourth and fifth unit pixels arranged along the first direction, the fourth and sixth unit pixels arranged along the second direction, wherein each of the first unit pixel, the second unit pixel, the third unit pixel, the fourth unit pixel, and the sixth unit pixel includes a first photoelectric conversion part and a second photoelectric conversion part arranged along the first direction, in the substrate, the fifth unit pixel includes a third photoelectric conversion part and a fourth photoelectric conversion part arranged along the second direction, in the substrate, on a level of the first surface, each of the first photoelectric conversion part and the second photoelectric conversion part has a dimension in the first direction less than a dimension thereof in the second direction, on a level of the second surface, each of the first photoelectric conversion part and the second photoelectric conversion part has a dimension in the first direction less than a dimension thereof in the second direction, on a level of the first surface, each of the third photoelectric conversion part and the fourth photoelectric conversion part has a dimension in the first direction greater than a dimension thereof in the second direction, and on a level of the second surface, each of the third photoelectric conversion part and the fourth photoelectric conversion part has a dimension in the first direction greater than a dimension thereof in the second direction.

6. The image sensor of claim 5, further comprising:

a pixel isolation pattern surrounding each of the first to sixth unit pixels;

a first separation pattern extending in the second direction, the first separation pattern being in the substrate between the first photoelectric conversion part and the second photoelectric conversion part; and a second separation pattern extending in the first direction, the second separation pattern being in the substrate between the third photoelectric conversion part and the fourth photoelectric conversion part.

7. The image sensor of claim 6, wherein a width of the pixel isolation pattern, a width of the first separation pattern, and a width of the second separation pattern each decrease from the second surface of the substrate toward the first surface of the substrate.

8. The image sensor of claim 5, wherein the first to third unit pixels each further include a first connecting part which connects the first photoelectric conversion part and the second photoelectric conversion part to each other, a length of the first connecting part in the second direction is smaller than a length of the first photoelectric conversion part and a length of the second photoelectric conversion part in the second direction, the fourth to sixth unit pixels each further include a second connecting part which connects the third photoelectric conversion part and the fourth photoelectric conversion part to each other, and a length of the second connecting part in the first direction is smaller than a length of the third photoelectric conversion part and a length of the fourth photoelectric conversion part in the first direction.

9. The image sensor of claim 8, wherein the substrate includes impurities of a first conductive type, the first photoelectric conversion part, the second photoelectric conversion part, the third photoelectric conversion part, and the fourth photoelectric conversion part each include a photoelectric conversion region including impurities of a second conductive type different from the first conductive type, and the first connecting part and the second connecting part do not include the photoelectric conversion region.

* * * * *